(12) United States Patent
Wang et al.

(10) Patent No.: US 9,998,644 B1
(45) Date of Patent: *Jun. 12, 2018

(54) CAMERA MODULE AND MOLDED CIRCUIT BOARD ASSEMBLY AND MANUFACTURING METHOD THEREOF

(71) Applicant: NINGBO SUNNY OPOTECH CO., LTD., Ningbo, Zhejiang (CN)

(72) Inventors: Mingzhu Wang, Ningbo (CN); Zhenyu Chen, Ningbo (CN); Nan Guo, Ningbo (CN); Takehiko Tanaka, Ningbo (CN); Bojie Zhao, Ningbo (CN); Zilong Deng, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/460,227

(22) Filed: Mar. 15, 2017

Related U.S. Application Data

(63) Continuation of application No. 15/387,613, filed on Dec. 21, 2016.

(30) Foreign Application Priority Data

Aug. 1, 2016 (CN) .......................... 2016 1 0626667
Aug. 1, 2016 (CN) ..................... 2016 2 0826035 U

(51) Int. Cl.
*H04N 5/225* (2006.01)
*H05K 1/02* (2006.01)
*H05K 1/18* (2006.01)
*H05K 5/00* (2006.01)

(52) U.S. Cl.
CPC ......... *H04N 5/2253* (2013.01); *H04N 5/2254* (2013.01); *H04N 5/2257* (2013.01); *H05K 1/0274* (2013.01); *H05K 1/181* (2013.01); *H05K 5/0073* (2013.01); *H05K 2201/10121* (2013.01); *H05K 2201/10151* (2013.01)

(58) Field of Classification Search
CPC .. H04N 5/2253; H04N 5/2254; H04N 5/2257; H01L 27/146–27/14609; H01L 31/0203; H04M 1/0264; G02B 7/02–7/025; G02B 13/001–13/009
See application file for complete search history.

(56) References Cited

U.S. PATENT DOCUMENTS

2005/0263312 A1* 12/2005 Bolken ............... H01L 21/4803
174/559
2011/0194023 A1* 8/2011 Tam ....................... G03B 17/02
348/374

* cited by examiner

*Primary Examiner* — Paul Berardesca
(74) *Attorney, Agent, or Firm* — Raymond Y. Chan; David and Raymond Patent Firm

(57) ABSTRACT

A camera module and its molded circuit board assembly and manufacturing method are disclosed, wherein the molded circuit board assembly includes a circuit board and a molded base integrally formed with the circuit board through a molding process. The molded base forms a light window disposed corresponding to a photosensitive element of the camera module, wherein the light window is configured to have a trapezoidal or to multi-stair trapezoidal shape cross section which has diameters increasing from bottom to top to facilitate demolding, so as to prevent damage to the molded base, and to avoid stray light.

30 Claims, 19 Drawing Sheets

B

A-A

C-C

C-C

E-E

C-C

CAMERA MODULE AND MOLDED CIRCUIT BOARD ASSEMBLY AND MANUFACTURING METHOD THEREOF

CROSS REFERENCE OF RELATED APPLICATION

This application is a Continuation application that claims the benefit of priority under 35 U.S.C. § 119 to a non-provisional application, application Ser. No. 15/387,613, filed Dec. 21, 2016, which is incorporated herewith by reference in its entity.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to camera modules, and more particularly to a camera module and molded circuit board assembly and manufacturing method thereof.

Description of Related Arts

A camera module is one of the indispensable components of an intelligent electronic device such as smartphone, camera, computer device, wearable device, and the like. With the continuous development of a variety of intelligent devices and the popularity of the intelligent devices, the camera module requirements are getting higher and higher.

In recent years, intelligent electronic devices have been developed by leaps and bounds, the growing trend of the intelligent electronic devices is towards thinner and thinner. In order to adapt such development, the camera module of the intelligent electronic device is required to be multi-functional, lightweight and compact in size, so that electronic equipment can be made thinner and thinner while meeting its imaging requirements. Therefore, the camera module manufacturers continue to focus on designing and manufacturing camera modules that meet these requirements.

Molded packaging technology is an emerging packaging technology developed from the conventional COB (Chip on Board) packaging technology. As shown in FIG. 1A of the drawings, a circuit board encapsulated by a conventional integrated packaging technology is illustrated. In this structure, the encapsulation portion 1 is integrally encapsulated on a circuit board 2 and a photosensitive chip 3, and the electronic components on the circuit board and the leads for electrically connecting the chip and the circuit board are covered, so that the occupied space of the electronic components is reduced, the size of the camera module can thus be reduced, and the problem that the dust attached to the electronic component affecting the image quality of the camera module is solved too.

Compared with the conventional holder-type COB packaging technology, this packaging technology has more advantages in theory. However, in a period of time, this package technology only stays in the theoretical or manual experimental stages, and did not get very good implement, and is not put into actual production for quantitative production. The reasons are following aspects.

Firstly, although the integral packaging technology in other large industrial areas is a well-known technology, in the field of camera module, it is a new application. Different industries need to mold different objects with different problems. For example, the body of a smartphone becomes thinner and thinner, so that the thickness of the smartphone becomes thinner and thinner. As a result, camera modules are also required to have such a thinner thickness to avoid the increase of the overall thickness of the phone. It is understandable that components of the camera module are manufactured in a relatively small size level, so that the ideal structure of the camera module cannot be produced by the conventional methods. In the above-described configuration, it is usually necessary to form a through-hole, which is usually designed to have a vertical prismatic column shape, in the encapsulation portion 1 to provide a light path for the photosensitive chip 3 on the circuit board 2. The structure has not particularly large defects in theory, but it is not taking the actual production into account. In other words, this technology is only in the handmade test stage instead of being put into actual mass productions. More specifically, as a molding mould is generally needed in the packaging technology, as shown in FIG. 1B and FIG. 1C of the drawings. When a molding block 4 of an upper mould of the molding mould is a vertical prismatic column, during a molding process, on the contacting position of the upper mould and the encapsulation portion 1, and when the mould is detaching from the molding material, as the bottom of the upper mold is sharp-edged, the upper mould influences the shape of the encapsulation portion 1 when the mould is opened for demoulding and causes deformation of the encapsulation portion 1 such as an occurrence of flashing. In addition, when the upper mould is being pulled out and moved away from the encapsulation portion 1, an outer side surface of the molding block 4 of the upper mould and the encapsulation portion 1 have a large frictional force therebetween and the encapsulation portion 1 may be damaged. This adverse effect is likely to be negligible in an industry of a relatively large size product, but in the camera module field that has a small in size and fine and precise requirement, it becomes a critical factor. Therefore, the vertical prismatic column shaped through-hole structure is feasible in theory but is not suitable for mass productions in practice.

Secondly, a camera module is an optical electronic device and light is an important factor to determine the image quality. As shown in FIG. 1D of the drawings, in the conventional holder assembling manner, the holder 5 mounted on the circuit board is required to reserve a mounting space 6 for the electronic components. The mounting space 6 forms an indent space and increases the size of the camera module. However, after the light incidents, there is less light directly projecting to the inner wall of the holder. Therefore, the reflected light of the inner wall of the holder is less and does not affect the imaging quality. As shown in FIG. 1E of the drawings, when the holder is replaced into the conventional prismatic column-shaped encapsulation portion 1, compared with the structure of the holder, after light incidents on the lens in a same incident angle, there is no reflected light in the holder, but the integral package structure affects the inner wall of the encapsulation portion 1 and the reflected light easily reaches the photosensitive chip 3 so as to increase the influence of stray light and that the imaging quality of the camera module is degraded accordingly. Therefore, in the aspect of the optical imaging quality, the prismatic column shaped through-hole configuration formed in the encapsulation portion 1 is not suitable for industrial application.

Last but not least, when the encapsulation portion 1 is assembled in a camera module, it is necessary to mount a lens or a motor to the encapsulation portion 1, so that the encapsulation portion 1 is needed to meet a certain structural strength. Therefore, the shape of the encapsulation portion 1 should be designed in regard to the light flux, the structural strength, the light reflectivity, and the damage prevention during demoulding etc. However, the structure of the conventional encapsulation portion 1 is obviously not considered regarding these factors.

SUMMARY OF THE PRESENT INVENTION

The invention is advantageous in that it provides a camera module and a molded circuit board assembly thereof and a manufacturing method thereof, wherein the camera module comprises the molded circuit board assembly which is capable of enabling a large-scale mass production by a molding mould through a molding process.

Another advantage of the invention is to provide a camera module and its molded circuit board assembly and manufacturing method, wherein the molded circuit board assembly comprises a circuit board, a photosensitive element and a molded base integrally formed on the circuit board, and the molded base forms a light window, wherein the light window is not a prismatic column shape of the prior art, so that in a manufacturing process, the damage to the molded base by a light window forming block of the molding mould is reduced, and it is convenient to the removal the light window forming block during demoulding.

Another advantage of the invention is to provide a camera module and its molded circuit board assembly and manufacturing method, wherein at least one portion of the molded base integrally is extended from the circuit board and an optical axis direction forms a first inclination angle which is an acute angle and is benefit for demoulding of the molded base, wherein after the molded base is formed by the molding process, the light window forming block is able to be smoothly pulled out during demoulding to reduce friction with the molded base, so that the molded base is kept in its original shape and condition without damage to reduce the influence of the removal of the light window forming block.

Another advantage of the invention is to provide a camera module and its molded circuit board assembly and manufacturing method, wherein at least one portion of the inner side surface of the molded base extending integrally from the top surface of the circuit board and the optical axis form an angle which is defined as a first inclination angle, so that the light incident on the inner side surface is less likely to reach the photosensitive element, and the influence of the stray light on the image quality is reduced.

Another advantage of the invention is to provide a camera module and its molded circuit board assembly and manufacturing method, wherein at least one outer side surface of the molded base and the optical axis form an angle which is an acute angle and is defined as a second inclination angle, wherein when the molded base is manufactured by the molding mould and when dividing blocks of the molding mould are detached at the outside of the molded base, the friction between the dividing blocks of the molding mould and the outer side surface of the molded base is remained unchanged such that the dividing blocks of the molding mould are easy to remove out.

Another advantage of the invention is to provide a camera module and its molded circuit board assembly and manufacturing method, wherein the inner side of the molded base successively has a first portion inner side surface inclined from the circuit board, a second portion inner side surface extending from the first portion inner side surface, and a third portion inner side surface aslant extending from the second portion inner side surface, wherein the third portion inner side surface and the optical axis form an angle which is an acute angle and is defined as a third inclination angle, so that when the light window forming block of the molded base is released, the friction between the base portion of the light window forming block and the inner side of the top end of the molded base is reduced, so that the second portion inner side surface of the molded base is remained unchanged such that the dividing blocks of the molding mould are easy to remove during remoulding.

Another advantage of the invention is to provide a camera module and its molded circuit board assembly and manufacturing method, wherein the first inclination angle is in a predetermined range to facilitate the mould release of the molded base without damaging the molded base.

Another advantage of the invention is to provide a camera module and its molded circuit board assembly and manufacturing method, wherein the bottom side of the molding mould is generally provided with an elastic film layer and the inclination angles are not right-angles so as to prevent piercing through the film layer.

Another advantage of the invention is to provide a camera module and its molded circuit board assembly and manufacturing method, wherein the molded base has a top side surface, the first, second and third inclination angles are restricted within predetermined ranges respectively to facilitate removal of the light window forming block and the dividing blocks, so that the size of the top side surface is not too small to provide a firm mounting area for a lens actuator or a lens of the camera module.

Another advantage of the invention is to provide a camera module and its molded circuit board assembly and manufacturing method, wherein the first, second and third inclination angles are restricted within predetermined ranges respectively to facilitate removal of the light window forming block and to provide a firm mounting area for an optical filter or an optical filter holder of the camera module.

Another advantage of the invention is to provide a camera module and its molded circuit board assembly and manufacturing method, wherein the molded base forms a sloped light window, which increases light flux and meets the requirements of the field of view and angular incidence of the photosensitive element.

Another advantage of the invention is to provide a camera module and its molded circuit board assembly and manufacturing method, wherein each of the demoulding angles is provided with a predetermined angular range, thereby securing the structural strength and the light reflectance of the molded base and reducing demould friction.

Additional advantages and features of the invention will become apparent from the description which follows, and may be realized by means of the instrumentalities and combinations particular point out in the appended claims.

According to the present invention, the foregoing and other objects and advantages are attained by a molded circuit board assembly for a camera module, which comprises at least one circuit board and at least one molded base integrally formed with the circuit board through a molding process, wherein the molded base forms at least one light window which provides a light path for a photosensitive element of the camera module, and at least one portion of an inner side surface of the molded base which is integrally extended form the circuit board is aslant extended.

In some embodiments, an included angle of the portion of the inner side surface of the molded base and an optical axis line direction of the camera module has a predetermined range of 3°~30°.

In some embodiments, the molded base has an inner side surface which is linearly extended from the circuit board, so that the overall inner side surface of the molded base is aslant extended, and the inner side surface of the molded base and an optical axis line direction of the camera module define an inclination angle α which is convenient for demoulding and is capable of avoiding stray lights, wherein a range of the inclination angle α is 3°~30°; a numerical value range of the inclination angle α is selected from a group consisting of 3°~15°, 15°~20°, and 20°~30°.

In some embodiments, the molded base has an outer side surface which is integrally and flatly extended from the circuit board, wherein the outer side surface of the molded base and an optical axis line direction of the camera module have an inclination angle γ which is convenient for demoulding, wherein a range of the inclination angle γ is 3°~45°; a numerical value range of the inclination angle γ is selected from a group consisting of 3°~15°, 15°~30° and 30°~45°.

In some embodiments, a top groove is formed on a top end of the molded base, and the molded base has a curved extending inner surface comprising a first portion inner side surface, a second portion inner side surface and a third portion inner side surface, which are successively and integrally extended, wherein the first portion inner side surface is integrally and aslant extended from the circuit board, and the third portion inner side surface is integrally and aslant extended from the second portion inner side surface, wherein the second portion inner side surface and the third portion inner side surface define the top groove.

In some embodiments, the first portion inner side surface of the molded base and an optical axis line direction of the camera module form an inclination angle α which is convenient for demoulding and is capable of avoiding stray lights, wherein a range of the inclination angle α is 3°~30°, wherein the third portion inner side surface of the molded base and the optical axis line direction of the camera module define an inclination angle β which is convenient for demoulding and is capable of avoiding stray lights, wherein a range of the inclination angle β is 3°~30°.

In some embodiments, a numerical value range of the inclination angle α is selected from a group consisting of 3°~15°, 15°~20°, and 20°~30°, wherein a numerical value range of the inclination angle β is selected from a group consisting of 3°~15°, 15°~20° and 20°~30°.

In some embodiments, the second portion inner side surface of the molded base is parallel to the top surface of the photosensitive element.

In some embodiments, the molded base has an outer side surface which is flatly extended from the circuit board, wherein the outer side surface of the molded base comprises a plurality of outer peripheral surfaces arranged along an outer peripheral direction of the molded base, wherein at least one outer side surface of the molded base and the optical axis line direction of the camera module define an inclination angle γ which is convenient for demoulding, wherein a range of the inclination angle γ is 3°~45°; a numerical value range of the inclination angle γ is selected from a group consisting of 3°~15°, 15°~30° and 30°~45°.

In some embodiments, the circuit board comprises a base board and a set of electronic components, wherein the molded base encloses the electronic components.

In some embodiments, the molded circuit board assembly further comprises one or more lens actuator pin grooves, wherein a pin groove wall forming each of the lens actuator pin grooves and the optical axis line direction of the camera module define an inclination angle δ for facilitating demoulding, wherein a range of the inclination angle δ is 3°~30°.

In some embodiments, at an outer side of at least one outer peripheral surface of the outer side surface of the molded base, a base board of the circuit board has a press-fit distance W which is convenient to press-fit for at least one dividing block of a molding mould in the molding process, wherein a numerical value range of the press-fit distance W is 0.1~0.6 mm.

In some embodiments, a reflectivity of a material surface of the molded base is less than 5% in the wavelength range of 435-660 nm.

According to the present invention, the foregoing and other objects and advantages are also attained by a camera module, comprising at least one lens, at least one photosensitive element, and at least one molded circuit board assembly, wherein the molded circuit board assembly comprises at least one circuit board and at least one molded base integrally formed with the circuit board through a molding process, wherein the molded base forms at least one light window which provides a light path for the photosensitive element and the lens, wherein at least one portion of an inner side surface of the molded base integrally extended form the circuit board is aslant extended for easy demoulding in the molding process.

In some embodiments, the camera module further comprises at least one optical filter installed on a top end of the molded base.

In some embodiments, the camera module further comprises at least one optical filter installed in the top groove of the molded base.

In some embodiments, the camera module further comprises at least one optical filter holder and at least one optical filter, wherein the optical filter is mounted on the optical filter holder and the optical filter holder is mounted on a top end of the molded base.

In some embodiments, the camera module further comprises at least one optical filter holder and at least one optical filter, wherein the optical filter is mounted on the optical filter holder and the optical filter holder is mounted in the top groove of the molded base.

In some embodiments, the camera module further comprises at least one lens actuator mounted on a top side of the molded base such that the molded base supports the lens actuator, wherein the lens is installed in the lens actuator to perform automatic focusing.

In some embodiments, a plurality of the camera modules is assembled into a cameral module array.

In some embodiments, the molded circuit board assembly comprises a plurality of the light windows so as to form a cameral module array with a plurality of the lenses.

According to the present invention, the foregoing and other objects and advantages are also attained by an electronic device comprising one or more the camera modules and the electronic device can be, but not limited to, a mobile phone, a computer, a television, an intelligent wearable equipment, a transportation tool, a camera, or a monitoring device.

According to the present invention, the foregoing and other objects and advantages are also attained by a molding mould, for manufacturing at least one molded circuit board assembly of a camera module, comprising a first mould and a second mound, wherein when the first mould and the second mound are closed to form at least a molding chamber therein, and at least one light window forming block and a base forming guide groove disposed around the light window forming block are provided in the molding chamber of the molding mould, wherein when at least one circuit board is placed in the molding chamber, a molding material filled in the base forming guide groove is solidified from a liquid state to a solid state under temperature control, wherein a molded base is formed at a position corresponding to the base forming guide groove and a light window of the molded base is formed at a position corresponding to the light window forming block, wherein the molded base is integrally molded on the circuit board so as to form the molded circuit board assembly of the camera module.

In some embodiments, a base inner side surface forming surface is aslant extended along an outer peripheral region of the light window forming block to form an integrally and lineally extending inner side surface of the molded base.

In some embodiments, an inclination angle α is formed at the base inner side surface forming surface of the light window forming block with respect to a vertical line direction of the camera module for facilitating mould release, has a range of 3°~30°.

In some embodiments, the light window forming block comprises a press head portion and a groove forming portion integrally extended from the groove forming portion, wherein the groove forming portion has a larger diameter than the press head portion to form a top groove on a top side of the molded base.

In some embodiments, an outer side surface of the press head portion along an outer peripheral region of the press head portion and the vertical line direction have an inclination angle α for facilitating demoulding and avoiding stray lights, wherein a range of the inclination angle α is 10°~80°, wherein an outer side surface of the groove forming portion and the vertical line direction define an inclination angle β, wherein a range of the inclination angle β is 3°~30°.

In some embodiments, the first mould comprises at least one division block having a base outer side surface forming surface, wherein the base outer side surface forming surface and the vertical line direction define an inclination angle γ for facilitating demoulding and avoiding stray lights, wherein a range of the inclination angle γ is 3°~45°.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
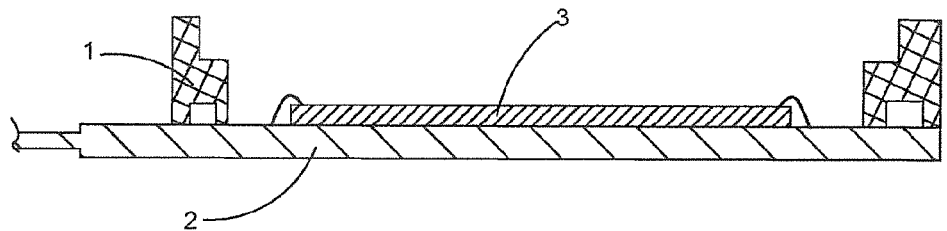
FIG. 1A is a schematic view of a conventional molded photosensitive assembly manufactured by a conventional encapsulating technology.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. that indicate relations of directions or positions are based on the relations of directions or positions shown in the appended drawings, which are only to facilitate descriptions of the present invention and to simplify the descriptions, rather than to indicate or imply that the referred device or element is limited to the specific direction or to be operated or configured in the specific direction. Therefore, the above mentioned terminologies shall not be interpreted as confine to the present invention.

It is understandable that the term "a" or "an" should be understood as "at least one" or "one or more". In other words, in some embodiments, the number of an element can be one and in other embodiment the number of the element can be more than one. The term "a" or "an" is not construed as a limitation of quantity.

Referring to FIG. 2 to FIG. 9 of the drawings, a camera module 100 according to a first preferred embodiment of the present invention is illustrated. The camera module 100 can be applied to various electronic devices, such as smart phones, wearable devices, computer equipment, televisions, vehicles, cameras, monitoring devices, and etc. The electronic devices disclosed above are exemplary only and not intended to be limiting. The camera module 100 is cooperated with the electronic devices to perform image acquisition and reproduction of a target object.

More specifically, a molded circuit board assembly 10 of the camera module 100 and a manufacturing equipment 200 for the camera module 100 are illustrated according to the first preferred embodiment of the present invention. The molded circuit board assembly 10 comprises a circuit board 11 and a molded base 12. Wherein the molded base 12 of the present invention is integrally packaged and molded on the circuit board 11 by the manufacturing equipment 200, so that the molded base 12 is capable of replacing a conventional holder or a support of a conventional cameral module, and it is unlike a conventional packaging process which is required to adhere the holder or the support to the circuit board by glue.

The camera module 100 further comprises at least a lens 30 and at least a photosensitive element 13. Wherein the molded base 12 comprises an annular molding body 121 and has a light window 122 in a middle portion thereof to provide a light path for the lens 30 and the photosensitive element 13. The photosensitive element 13 is operatively connected to the circuit board 11. For example, the photosensitive element 13 is connected to the circuit board 11 by connecting elements such as lead wires 15 through a COB (Chip on Board) process, and the photosensitive element 13 is positioned on a top side of the circuit board 11. The photosensitive element 13 and the lens 30 are respectively assembled on two sides of the molded base 12 and are optical aligned in such a manner that the light passing through the lens 30 is able to reach the photosensitive element 13 via the light window 122, so that the camera module 100 is able to provide an optical image through photoelectric conversion.

Figure 3A:
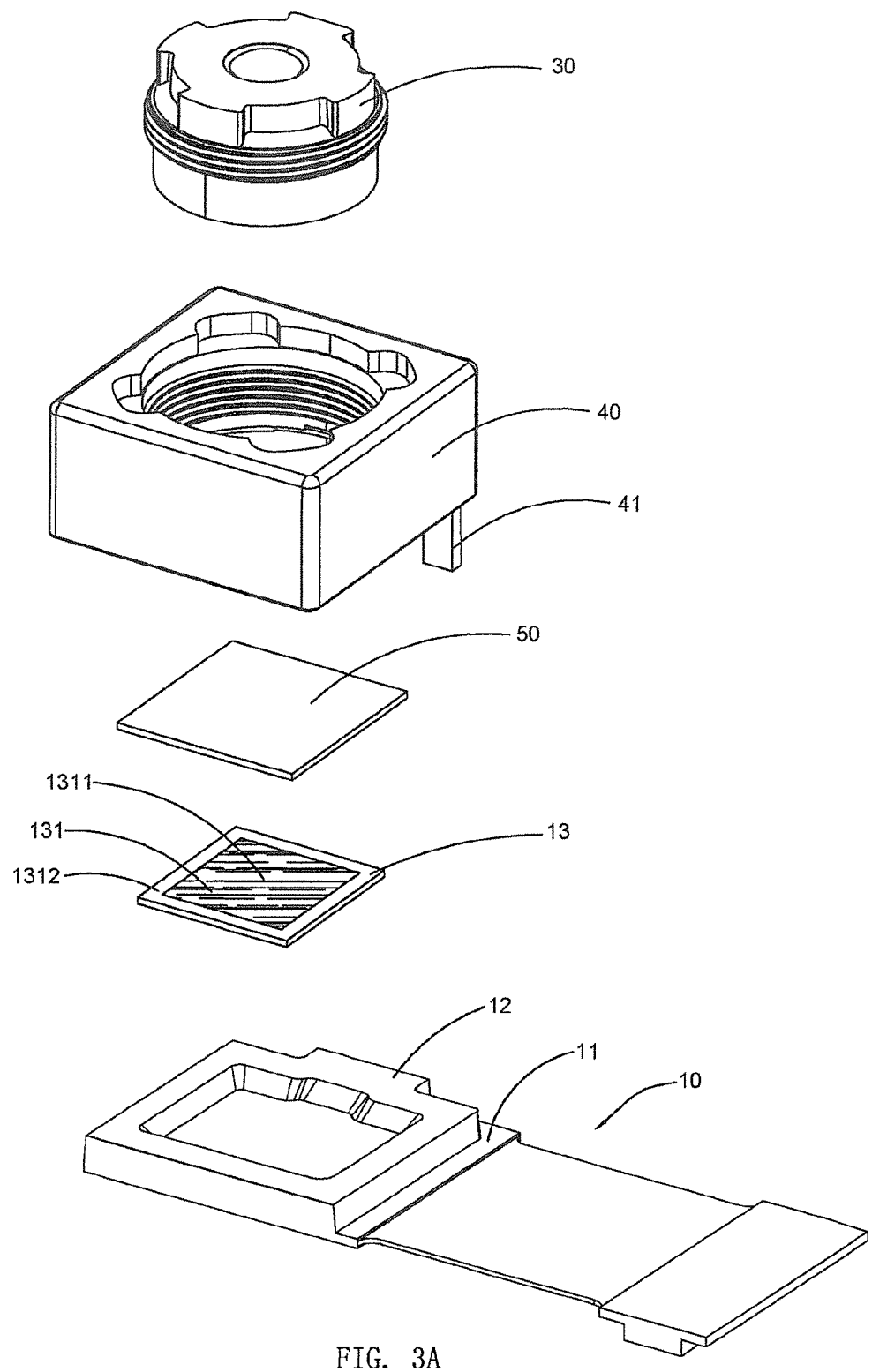
FIG. 3A is an exploded perspective view of the camera module according to the above first preferred embodiment of the present invention.
Figure 3B:
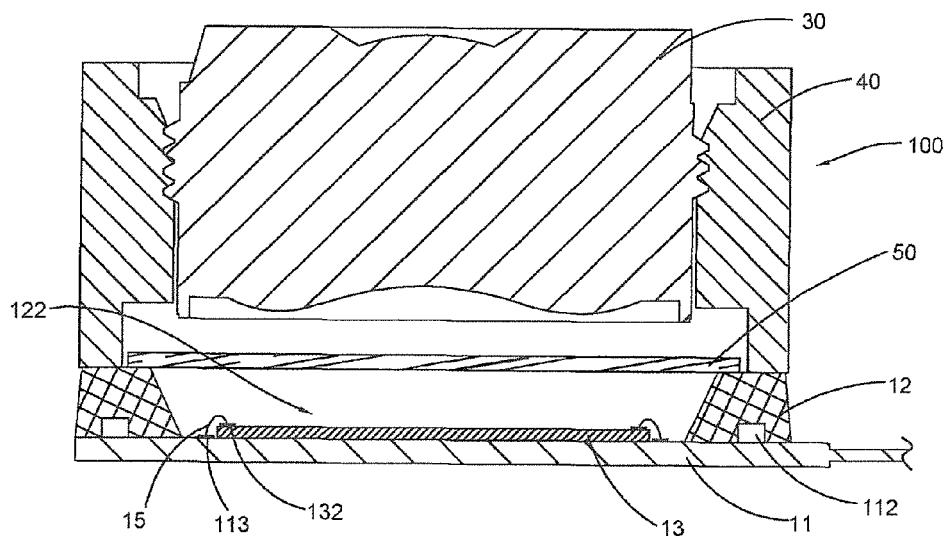
FIG. 3B is a cross-sectional view of the camera module along a length direction according to the above first preferred embodiment of the present invention.
Figure 4:
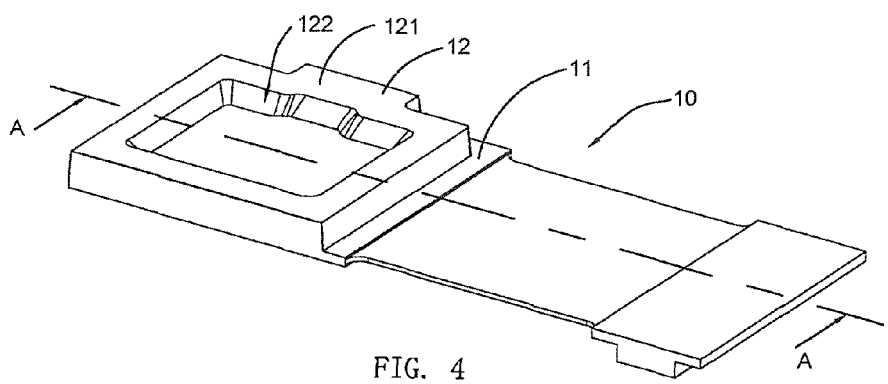
FIG. 4 is a perspective view of the molded circuit board assembly according to the above first preferred embodiment of the present invention.

As shown in FIG. 3A and FIG. 3B of the drawings, the camera module 100 can be an automatic-focus camera module which further comprises a lens actuator 40 such as a voice coil motor and a piezoelectric motor, the lens 30 is installed in the lens actuator 40. The molded base 12 is capable of supporting the lens actuator 40. An optical filter 50 is provided on a top side of the molded base 12 to filter light which passes through the lens 30 and the optical filter 50 can be an infrared cut-off filter. The automatic-focus camera module in this embodiment of the present invention as shown in the drawings and described above is exemplary only and not intended to be limiting. In other embodiment of the present invention, the lens 30 can be installed at the molded circuit board assembly 10 without the need of the lens actuator 40. In other words, the camera module 100 can be a fixed focus camera module, one skilled in the art would understand that the type of the cameral module is not intended to be limiting and the camera module 100 can be a fixed focus camera module or an automatic-focus camera module.

The circuit board 11 comprises a base board 111 and a plurality of electronic components 112. The plurality of electronic components 112 is formed on the base board 111 using a technology such as the surface mount technology, SMT. The electronic components 112 include but are not limited to resistors, capacitors, and other device drivers. In this embodiment of the invention, the molded base 12 is integrally molded to enclose the electronic components 112 to prevent objects such as dusts and debris of a conventional camera module from adhering to the electronic components 112 to further contaminate and pollute the photosensitive element 13 that adversely affects the imaging results. It is understandable that in another alternative mode of the embodiment the electronic components 112 is embedded in the base board 111, in other words, the electronic components 112 are not exposed to outside. The base board 111 of the circuit board 11 can be a rigid PCB, a flexible PCB, a rigid-flex PCB, or a ceramic substrate. It is worth mentioning that, in this preferred embodiment of the present invention, since the molded base 12 is integrally coated on the electronic components 112, the electronic components 112 are able to be not embedded within the base board 111. The base board 111 is merely used to form electric conductive lines, so that the finally obtained molded circuit board assembly 10 may have a smaller thickness.

In this preferred embodiment of the present invention, the photosensitive element 13 is overlappedly installed on a flat overlapping region of the circuit board 11, where is located at an inner side of the electronic components 112. The photosensitive element 13 has a top surface 131 which has a photosensitive area portion 1311 in the center and a non-photosensitive area portion 1312 around the photosensitive area portion 1311. The photosensitive element 13 is electrically conducted to the circuit board 11 by one or more electrical connecting elements such as lead wires 15. More specifically, the photosensitive element 13 has a photosensitive element connecting pad 132 and the circuit board 11 has a circuit board connecting pad 113. Two ends of each of the lead wires 15 are respectively connected to the photosensitive element connecting pad 132 and the circuit board connecting pad 113.

Figure 2:
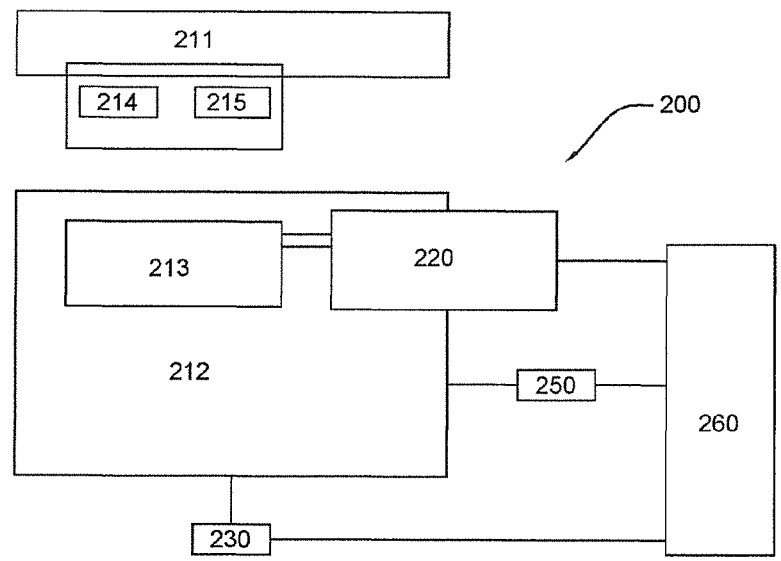
FIG. 2 is a schematic diagram of a molded circuit board assembly of a camera module according to a first preferred embodiment of the present invention.

Furthermore, as shown in FIG. 2 of the drawing, the manufacturing equipment 200 for the molded circuit board assembly 10 of the camera module 100 comprises a molding mould 210, a molding material feeding mechanism 220, a mould fixing unit 230, a temperature control unit 250, and a controller 260. A molding material 14 is placed within, or fed into by the molding material feeding mechanism 220, a base forming guide groove 215 of the molding mould 210. The mould fixing unit 230 controls the mould closing and mould releasing, i.e. an opened-mould position and a closed-mould position, of the molding mould 210. The temperature control unit 250 heats up or cools down the molding material 14. The controller 260 automatically controls operations of the molding material feeding mechanism 220, the mould fixing unit 230 and the temperature control unit 250 in the molding process.

The molding mould 210 comprises a first mould 211 and a second mould 212. The first mould 211 and the second mould 212 are able to be opened from each other and to be closed together to form a moulding chamber 213 therein under control of the mould fixing unit 230. In other words, the mould fixing unit 230 is able to separate the first mould 211 and the second mould 212 from each other and to close the first mould 211 and the second mould 212 together to define the molding chamber 213 therein. When the molding mould 210 is in the closed-mould position, the circuit board 11 is set within the molding chamber 213 and the liquid molding material 14 entered into the molding chamber 213 will integrally mold on the circuit board 11 to from the molded base 12, which will be integrally molded on the circuit board 11 after solidification.

More specifically, the molding mould 210 further comprises a light window forming block 214 and the base forming guide groove 215 formed around the light window forming block 214. When the first mould 211 and the second mould 212 are in the closed-mould position, the light window forming block 214 and the base forming guide groove 215 are extended inside of the molding chamber 213 and the liquid molding material 14 is filled into the base forming guide groove 215, as the position corresponding to the light window forming block 214 cannot be filled with the liquid molding material 14, so that the liquid molding material 14 forms the annular molding body 121 of the molded base 12 at the position of the base forming guide groove 215 and the light window 122 of the molded base 12 is formed at the position of the light window forming block 214 after solidification. The molding material 14 can be selected from nylon, LCP (Liquid Crystal Polymer), PP (Polypropylene), epoxy resin, and the like. One skilled in the art should understand that the material of the molding material 14 described above is exemplary only and not intended to be limiting.

The first mould 211 and the second mould 212 can be two moulds having a relative movement with each other. For example, one of the two moulds is stationary and the other of the two moulds is moveable. Alternatively, both of the two mounds are moveable, the present invention in this aspect described above is exemplary only and not intended to be limiting. In this embodiment of the present invention, the first mould 211 is specifically embodied as a fixed upper mould and the second mould 212 is specifically embodied as a moveable lower mould. The fixed upper mould and the moveable lower mould are provided coaxially. For example, the moveable lower mould can slide upwardly along a plurality of positioning shafts and can form the closed molding chamber 213 with the fixed upper mould in the closed-mould position.

The second mould 212 which is embodied as the lower mould has a circuit board positioning groove 2121. The circuit board positioning groove 2121 has a groove shape or is formed by a plurality of positioning posts for mounting and setting the circuit board 11 in position. The light window forming block 214 and the base forming guide groove 215 can be formed in the first mould 211 which is embodied as the upper mould. When the first mould 211 and the second mould 212 are in the closed-mould position, the molding chamber 213 is defined, and the liquid molding material 14 is filled into the base forming guide groove 215 at a top side of the circuit board 11, so that the molded base 12 is formed on the circuit board 11 and the top side of the photosensitive element 13.

It is understandable that the circuit board positioning groove 2121 also can be provided in the first mould 211 which is embodied as the upper mould adapted for mounting and setting the circuit board 11 in position. The light window forming block 214 and the base forming guide groove 215 can be formed in the first mould 211. When the first mould 211 and the second mould 212 are in the closed-mould position, the molding chamber 213 is defined. The circuit board 11 in the upper mound is arranged toward an obverse side and the liquid molding material 14 is filled into the base forming guide groove 215 which is on a bottom side of the inverted circuit board 11, so that the molded base 12 is formed on the bottom side of the inverted circuit board 11.

More specifically, when the first mould 211 and the second mould 212 are in the closed-mould position and perform the molding process, the light window forming block 214 is overlappedly and tightly positioned on the circuit board 11, so that the liquid form molding material 14 is blocked from entering the top surface 131 of the photosensitive area 1311 of the photosensitive element 13 and thus the light window 122 of the molded base 12 is formed corresponding to the position of the light window forming block 214.

It is understandable that, a molding surface of the first mould 211 forming the base forming guide groove 215 can be configured as a flat surface and in a same plane. Thus, when the molded base 12 is formed after solidification, a top surface of the molded base 12 is relatively smooth and flat, so that the molded base 12 provides a flat mounting condition for the lens 30 or other supporting components of the lens 30, thereby reducing a tilt error of the assembled camera module 100.

It is worth mentioning that the base forming guide groove 215 and the light window forming block 214 can be integrally molded on the first mould 211. In other words, the first mould 211 further comprises a detachable molding configuration, the molding configuration is formed with the base forming guide groove 215 and the light window forming block 214. Thus, different shapes and sizes of the base forming guide groove 215 and the light window forming block 214 are designed according to different shapes and sizes of the molded circuit board assembly 10 such as with different diameters and thickness of the molded base. Thus, as long as replacing different molding configuration, the manufacturing equipment is adapted to be applied on different specification requirements of the molded circuit board assembly 10. It is understandable that the second mould 212 correspondingly comprises a detachable fixed block to provide different shapes and sizes of the circuit board positioning groove 2121 so as to facilitate the replacement of different shapes and sizes of the circuit board 11.

It is understandable that the molding material 14 is a thermal fusible material such as a thermoplastic material. A melting and heating device turns the solid-state heat fusible material into the liquid form molding material 14 by heating and melting. During the molding process, the hot melted molding material 14 is solidified by a cooling process. The molding material 14 can also be a thermosetting material. The thermosetting material is heated and melt to turn into the liquid form molding material 14 by the melting and heating device. During the molding process, the thermosetting molding material 14 is solidified by a further heating process, and the molding material 14 cannot be melted again after solidification, thereby forming the molded base 12.

It is understandable that in the molding process of the present invention, the molding material 14 can be in form of blocks, pellets, or powder, which becomes liquid in the molding mould 210 after heating and is then cured to form the molded base 12 after solidification.

It is understandable that, in this embodiment, a molding process of the circuit board 11 is illustrated, and in the application of the manufacturing equipment 200, a plurality of independent circuit boards 11 can be molded at a same time. Alternatively, a joint board array operation is also adapted to be used as mentioned in the following second preferred embodiment.

Figure 8A:
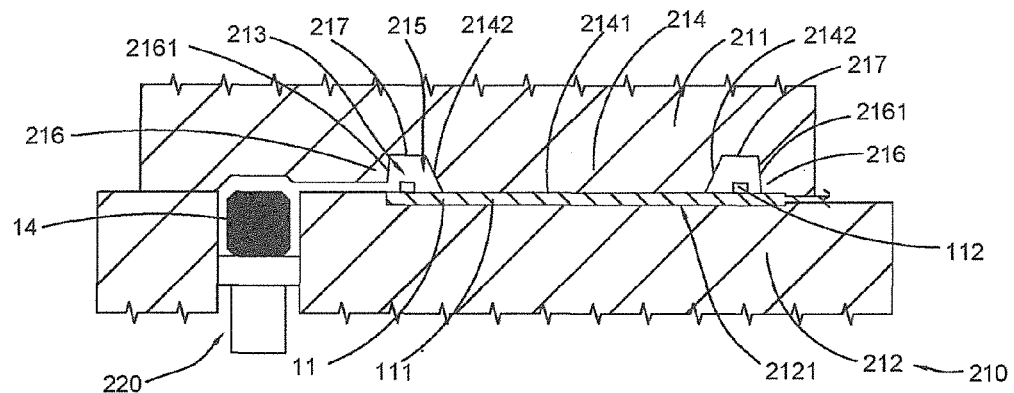
FIG. 8A is a cross-sectional view of the molded circuit board assembly according to the above preferred embodiment of the present invention, illustrating that a liquid molding material is pushed into a base forming guide groove by a molding mould; the cross-sectional view is along an A-A line of the FIG. 4.
Figure 8B:
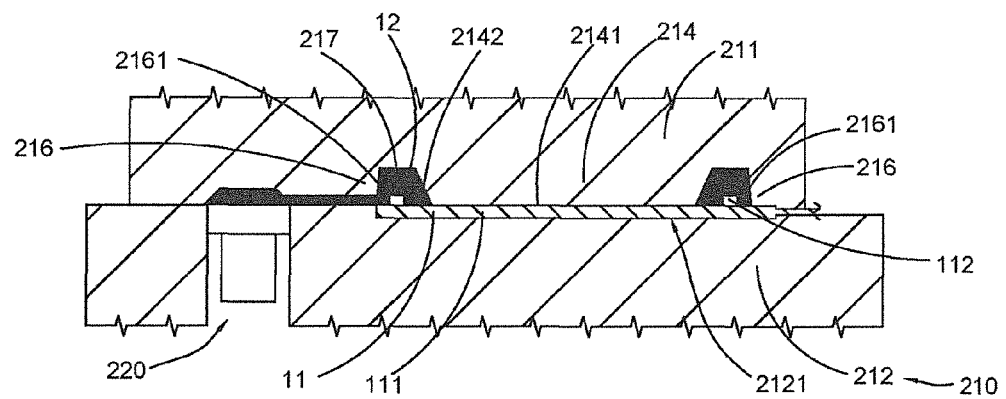
FIG. 8B is a cross-sectional view of the molded circuit board assembly according to the above preferred embodiment of the present invention, illustrating that the molding mould of a manufacturing equipment performs the molding process to form a molded base; the cross-sectional view is along the A-A line of the FIG. 4.
Figure 9:
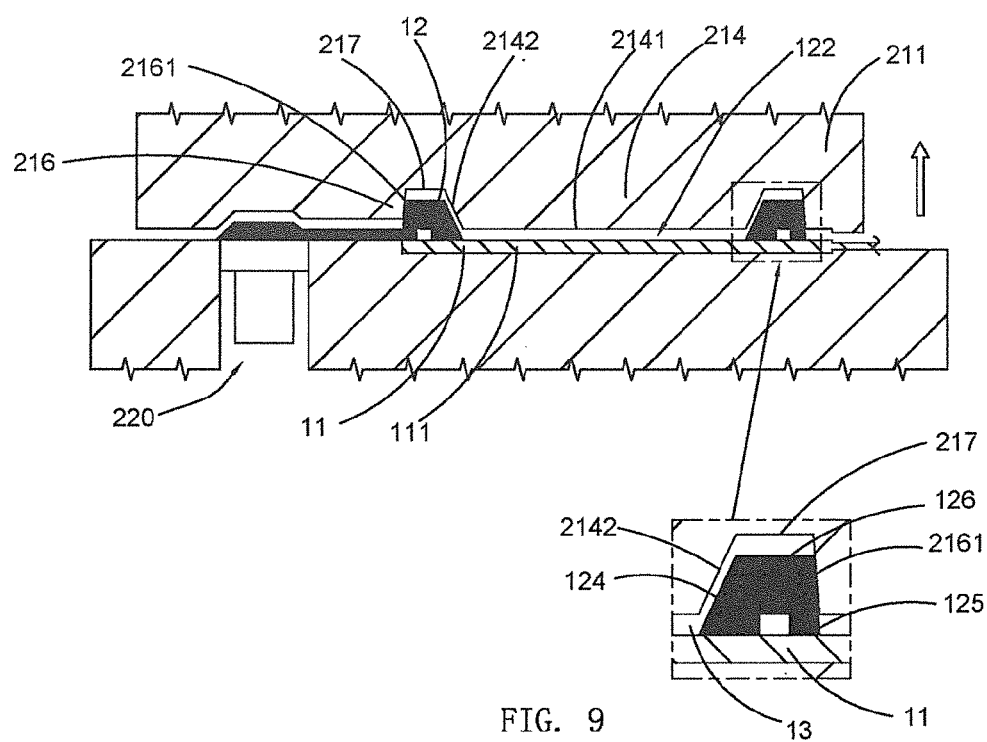
FIG. 9 is a schematic view illustrating a demoulding process of the molded circuit board assembly according to the above first preferred embodiment of the present invention.
Figure 10:
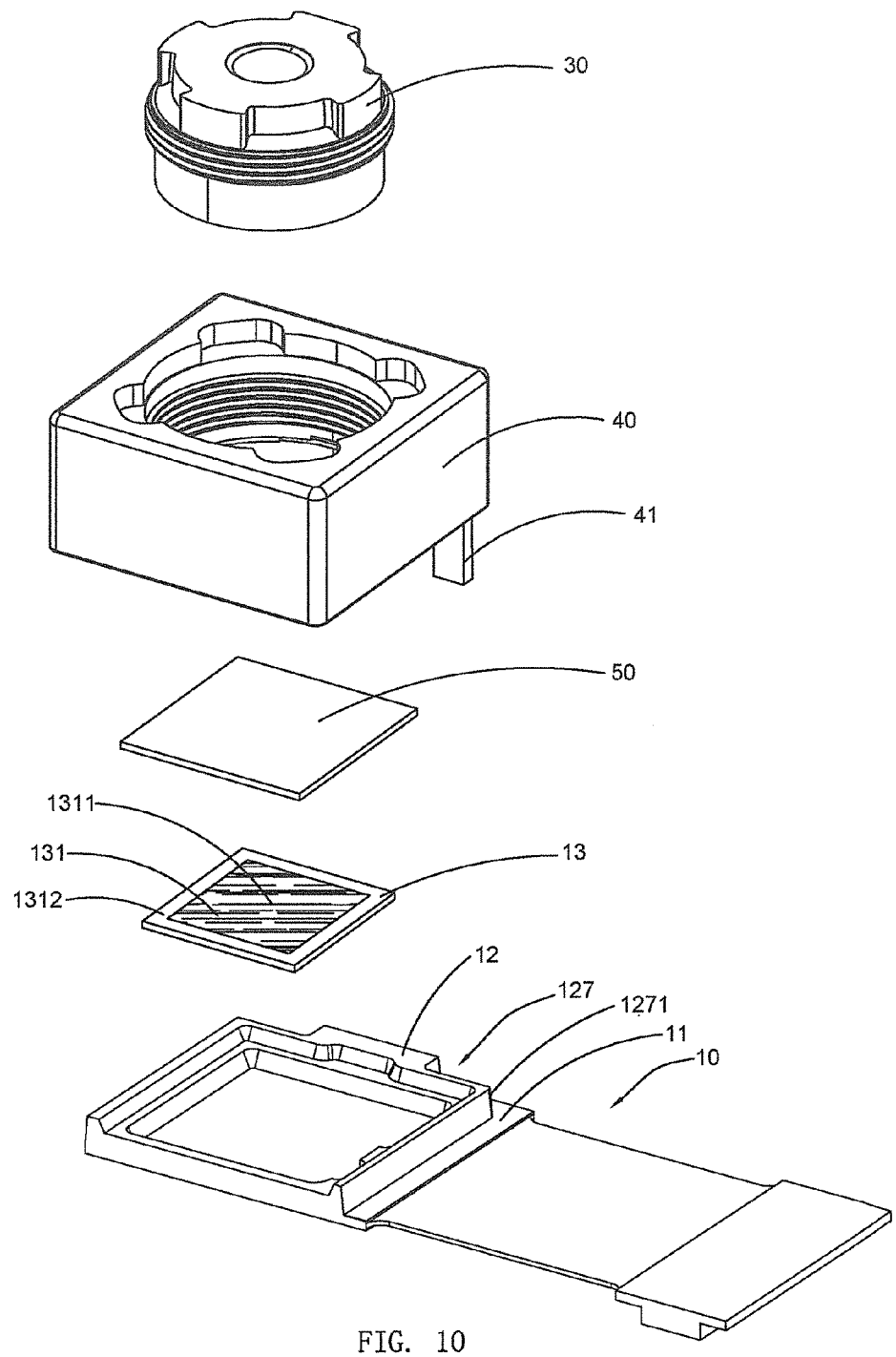
FIG. 10 is an exploded perspective view of the molded circuit board assembly according to a second preferred embodiment of the present invention.
Figure 11:
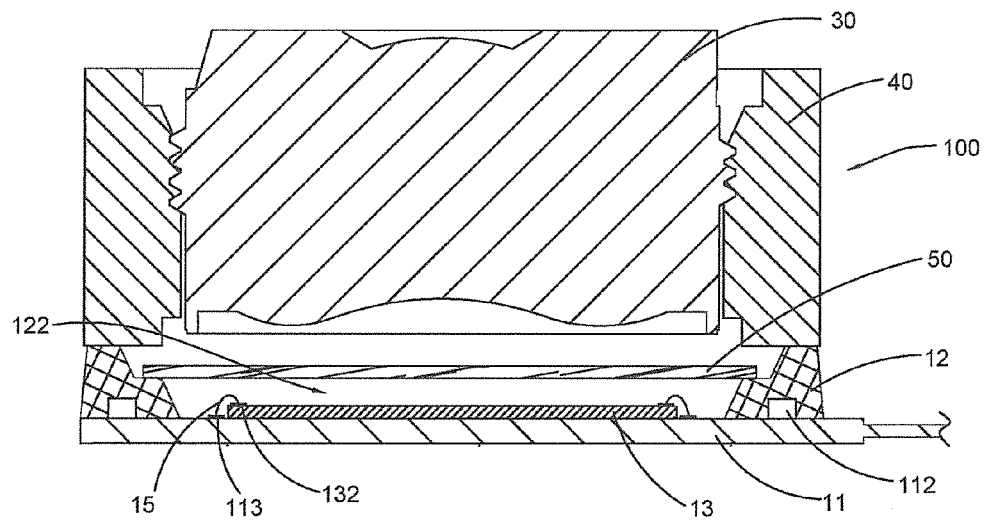
FIG. 11 is a cross-sectional view of the camera module along a length direction according to the above second preferred embodiment of the present invention.

Referring to FIG. 8A to FIG. 9 of the drawings, a manufacturing process of the molded circuit board assembly 10 of the camera module 100 according to the preferred embodiment of the present invention is illustrated. As shown in FIG. 8A of the drawings, the molding mould 210 is in the closed-mould position, and the circuit board 11 which is about to be molded and the solid molding material 14 are set in position. The solid molding material 14 is heated to melt into a liquid state or into a semi-solid state and filled into the base forming guide groove 215 until reaching a surrounding portion of the light window forming block 214.

As shown in FIG. 8B of the drawings, after the base forming guide groove 215 is filled with the liquid form molding material 14, the liquid molding material 14 is solidified to form the molded base 12 which is integrally formed on the circuit board 11. Taking the molding material 14 being embodied as a thermosetting material as an example, the heated and melted liquid form molding material 14 will be solidified to form the molded base 12 after being additional heated.

As shown in FIG. 9 of the drawings, after the molding material 14 is solidified and cured to form the molded base 12, a demoulding process is performed. In the demoulding process, the first mould 211 and the second mould 212 are moved away from each other by the mould fixing unit 230, and thus the light window forming block 214 is departed from the molded base 12 and the light window 122 is formed in the molded base 12.

Figure 1B:
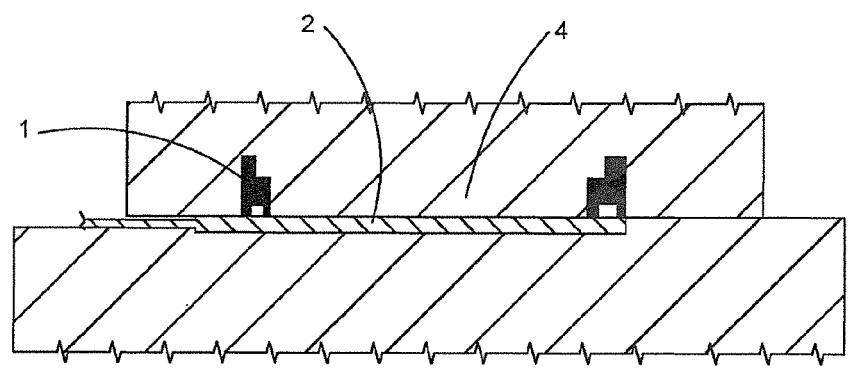
FIG. 1B is a schematic view of a conventional forming process for manufacturing the conventional encapsulated photosensitive assembly.
Figure 1C:
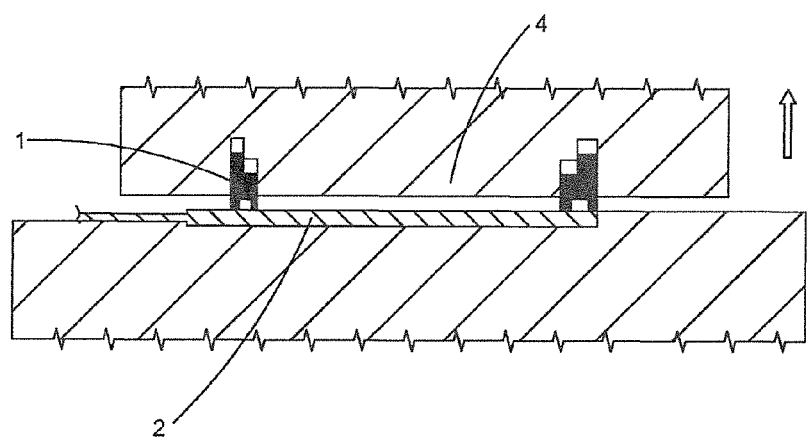
FIG. 1C is a schematic view of a demoulding process in the conventional encapsulating process for manufacturing the conventional encapsulated photosensitive assembly.

In the conventional art, as shown in FIG. 1B of the drawings, a bottom of a square-shaped molding block 4 has a sharp edge. During a demoulding process, the sharp edge generates a relatively large friction with the inner surface of an encapsulation portion 1, which will deform and damage the inner surface of the encapsulation portion 1. However, according to the present invention, the light window forming block 214 of the present invention is configured that the molded base 12 will not be deformed and damaged.

More specifically, in the preferred embodiment of the present invention, as shown in FIG. 8A to FIG. 9 of the drawings, the light window forming block 214 is made to have a taper shape in cross section. In other words, the light window forming block 214 has a pyramidal shape such as a truncated cone shape, and the interior of the light window forming block 214 is in solid form or is constructed to have a hollow form. In other words, it likes a hollow cover adapted to cover on top of the circuit board or the photosensitive element 13 electrically connected with the circuit board 11 in order to facilitate the subsequent molding process.

In this embodiment of the present invention, the light window forming block 214 is a solid structure. The light window forming block 214 has a press-fit surface 2141 on the bottom side thereof and a base inner side surface forming surface 2142 formed by a peripheral molding surface flatly and inwardly extended along a circumferential direction of the press-fit surface 2141. The included angle between the base inner side surface forming surface 2142 and a vertical line is defined as a first inclination angle $\alpha$, which is an acute angle rather than the 0 degree conventional included angle. More specifically, the first inclination angle $\alpha$ is ranged preferably from 10° to 80°, and more preferably 30° to 55°.

Figure 5:
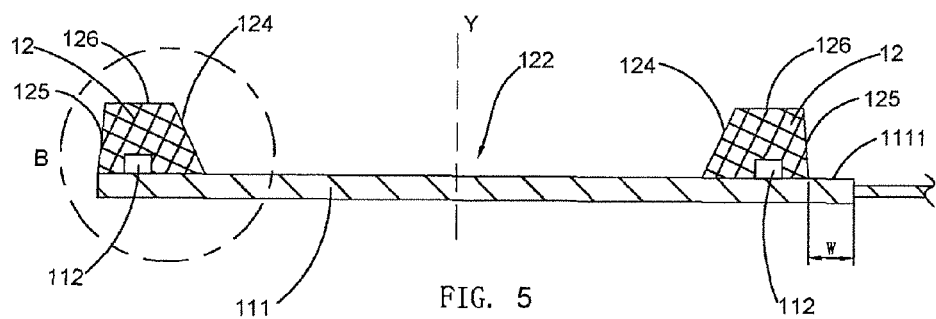
FIG. 5 is a cross-sectional view illustrating the molding mould of the camera module according to the above first preferred embodiment of the present invention along an A-A line of FIG. 4.
Figure 6:
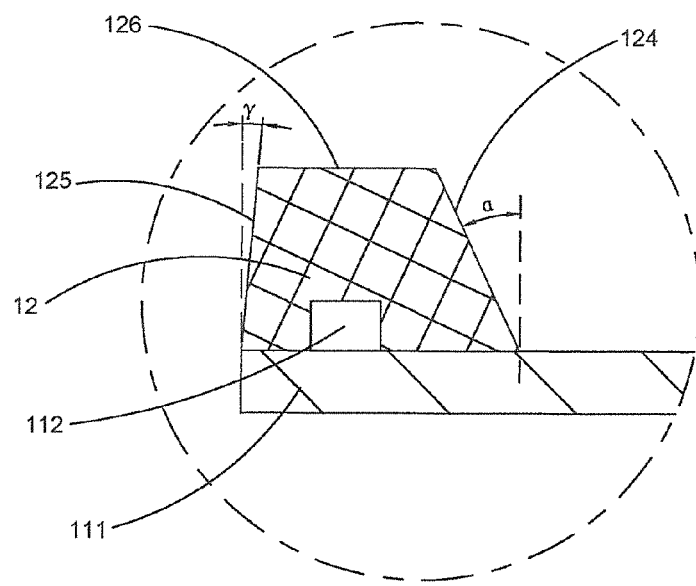
FIG. 6 is a partial enlarged schematic view illustrating an inclination angle for facilitating demoulding of the camera module according to the above first preferred embodiment of the present invention.

It is understandable that as shown in FIG. 5 and FIG. 6 of the drawings, the annular molding body 121 of the molded base 12 of the molded circuit board assembly 10 of the camera module 100 has a flatly extended inner side surface 124. Between the inner side surface 124 and a straight line direction of the optical axis Y of the photosensitive element 13 of the molded circuit board assembly 10, an included angle is defined, which is the same as the first inclination angle $\alpha$.

As shown in FIG. 8A of the drawings, the light window forming block 214 has a trapezoidal cross section which gradually increases from the bottom to the top. Accordingly, the light window 122 formed in the molded base 12 has a trapezoidal cross section which gradually increases from the bottom to the top. The size range of the first inclination angle $\alpha$ is preferably to 10° to 80°, and more preferably is 30° to 55° so as to facilitate demoulding without damaging the lead wires 15. In addition, the light window 122 of the molded base 12 having a trapezoidal cross section can save molding material and ensure its strength.

Figure 1D:
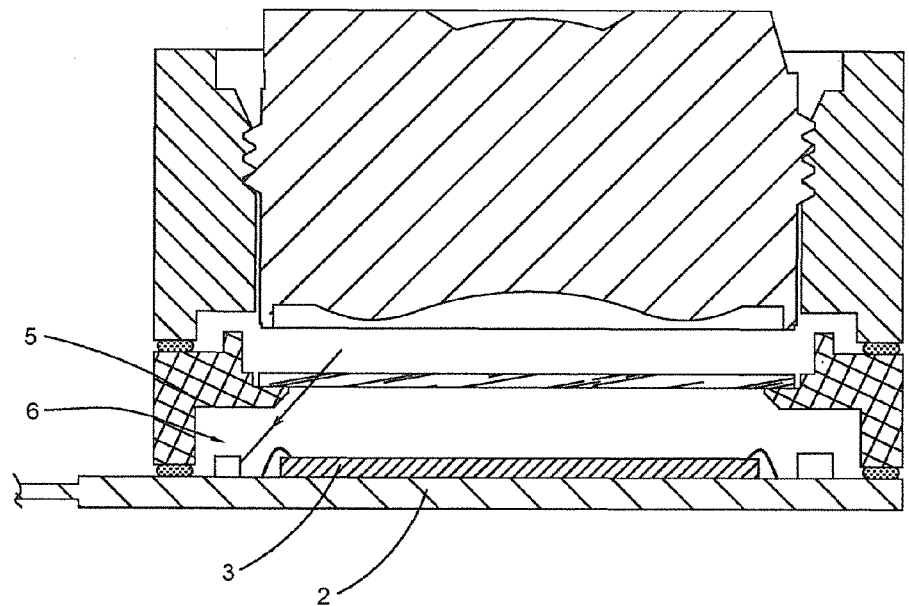
FIG. 1D is a schematic view illustrating a light path of a camera module packaged by a conventional COB technology.
Figure 1E:
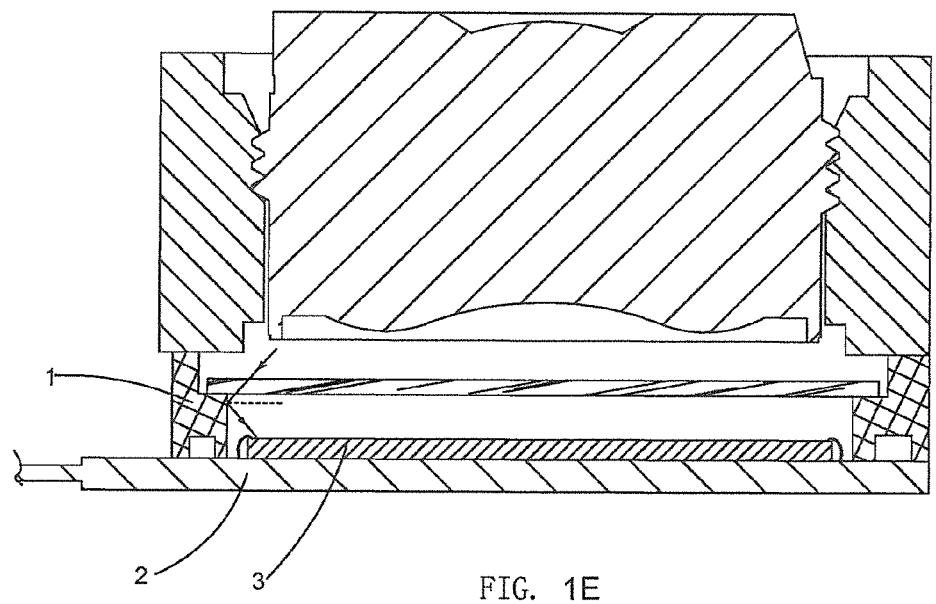
FIG. 1E is a schematic view illustrating a light path of a camera module by a conventional integrally packaging technology.
Figure 7:
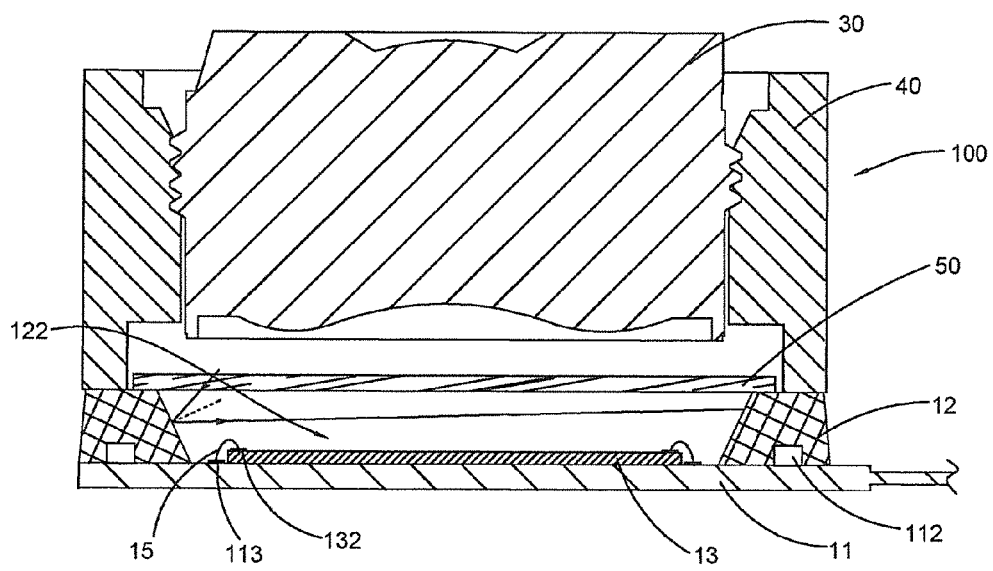
FIG. 7 is a schematic view illustrating the avoiding stray lights of the camera module according to the above first preferred embodiment of the present invention.

It is worth mentioning that it is also possible to effectively avoid the stray light by selecting the size range of the first included angle $\alpha$ according to the present invention. As shown in FIG. 1E of the drawings, according to a conventional molded and packaged camera module, the incident light through a lens has a portion reaching a photosensitive chip for photosensitive effect, and another portion, such as the light as shown in FIG. 1D, projecting onto the vertical inner walls of an encapsulation portion 1, which is easily reflected by the inner walls of the encapsulation portion 1 as reflected stray light to reach the photosensitive chip 3 to process the photoelectric conversion of the photosensitive chip 3, that adversely affect the imaging quality of the conventional camera module. However, according to the preferred embodiment of the present invention, as shown in FIG. 7 of the drawings, the incident light from the lens 30 has a portion reaching the photosensitive element 13 and another portion, such as the light in the same direction of light in FIG. 1D, projecting onto the inner side surface 124 of the molded base 12 and being reflected by the inner side surface 124 of the molded base 12, wherein the reflected light is distant from the photosensitive element 13 without reaching the photosensitive element 13 to avoid being processed in the photoelectric conversion process of the photosensitive element 13, so as to reduce the adverse influence of reflected stray light on the imaging quality of the camera module 100.

It is worth mentioning that in the embodiment of the present invention, the material surface of the molded base 12 has a reflectivity of less than 5% in the wavelength range of 435-660 nm. In other words, most of the incident light on the surface of the molded base 12 cannot be reflected to form the interference stray light reaching the photosensitive element 13, thereby remarkably reducing the adverse influence of reflected stray light.

In addition, as shown in the drawings, the molded base 12 has the inner side surface 124 extended along an inner circumferential direction thereof, an outer side surface 125 extended along an outer circumferential direction thereof, and an annular top side surface 126. The inner side surface 124 is extended integrally from the base board 111 of the circuit board 11. The outer side surface 125 is also extended integrally from the base board 111 of the circuit board 11. The first mould 211 of the molding mould 210 is further provided with one or more dividing blocks 216 for forming the outer side surface 125 of the molded base 12 during the molding process. More specifically, the dividing blocks 216 has a base outer side surface forming surface 2161 to determine a position and shape of the outer side surface 125 of the molded base 12 which is formed by the molding material 14 after solidification in the molding process. A top-side molding surface 217 is formed between the dividing blocks 216 and the light window forming block 214 to determine a position and shape of the top side surface 126 of the molded base 12 which is formed by the molding material 14 after solidification in the molding process. In the conventional art, the outer surface of the encapsulation portion 1 is perpendicular to a circuit board. In other words, a base outer surface molding surface of a partition block of the conventional mould is vertically oriented, so that during the demoulding process, the base outer surface molding surface of the partition block of the conventional mould is rubbed against the encapsulation portion 1, so that the demoulding process is inconvenient to operate, and the outer side surface of the encapsulation portion 1 is easily damaged.

However, according to the embodiment of the present invention, the base outer side surface forming surface 2161 has a second inclination angle $\gamma$ with respect to a vertical direction. Therefore, the same inclination angle $\gamma$ is defined between the outer side surface 125 of the molded base 12 with respect to the optical axis Y direction. In other words, when the molded base 12 is horizontally arranged, the outer side surface 125 of the molded base 12 has the second inclination angle $\gamma$ with respect to a vertical line. In order to facilitate demoulding, the second inclination angle $\gamma$ is an acute angle and should not be too large because the top side surface 126 of the molded base 12 is needed to have a sufficient size to facilitate the subsequent installment of lens 30 or lens actuator 40. In other words, if the second inclination angle $\gamma$ is too large and the inner side surface 124 and the outer side surface 125 of the molded base 12 are both in inclined shape, the length of the top side surface 126 becomes too small to securely install the lens 30 or the lens actuator 40. In addition, in this embodiment, the bottom portion of the lens actuator 40 has a mating surface fitting to the top side surface 126 of the molded base 12. When the top side surface 126 of the molded base 12 has a too small dimension, for example, less than the mating surface, it is inconvenient for alignment of the lens actuator 40. When the lens actuator 40 is mounted on the top side surface 126 of the molded base 12, the lens actuator 40 may be shaken and not stable, and the lens actuator 40 cannot be prevented from crashing and anti-collision. Accordingly, in a preferred embodiment of the present invention, the numerical maximum of the first inclination angle $\alpha$ is preferably not more than 30° and the numerical maximum of the second inclination angle $\gamma$ is preferably not more than 45°. In addition, in a numerical minimum of the second inclination angle $\gamma$, the demoulding operation of the molding process can be facilitated and the manufacturing of the molding mould 210 can also be facilitated. Therefore, the numerical minimum of the first inclination angle α and the second inclination angle γ is preferably not smaller than 3°. Therefore, the range of the first inclination angle α of the present invention is suitably 3° to 30°, more preferably 3° to 15°. The range of the second inclination angle γ of the present invention is suitably 3° to 45°, more preferably 3° to 15°. It is worth mentioning that, as shown in FIG. 5 of the drawings, a press-fit distance W is formed on an outer edge of the base board 111 of the circuit board 11 and the outer side surface 125 of the formed molded base 12, so that it is facilitate to demould and to press-fit the base board 111 of the circuit board 11. In other words, in the molding process, the dividing blocks 216 is suitable to press-fit on the region of the base board 111 of the circuit board 11, the press-fit distance W is a distance from a position which is the outer side surface 125 of the molded base 12 extended from the base board 111 of the circuit board 11 to the outer edge of the base board 111 of the circuit board 11. For example, the press-fit distance W has a range of 0.1~0.6 mm. In a specific example, the press-fit distance W is 0.2 mm.

It is understandable that, due to the ranging of the first inclination angle α and the second inclination angle γ, that is the inner side surface 124 and the outer side surface 125 of the molded base 12 having inclinations, during the demoulding process, the molded base 12 and the first mould 211 have a reduced friction and the molded base 12 is easy to be drafted out in such a manner that the molded base 12 has a better molding state. More specifically, when the molded base 12 is cured and formed after solidification in the molding process and in the demoulding process, the light window forming block 214 and the dividing blocks 216 begin to move vertically and upwardly, the base inner side surface forming surface 2142 of the light window forming block 214 and the base outer side surface forming surface 2161 of the dividing blocks 216 are respectively separated with the inner side surface 124 of the molded base 12 and the outer side surface 125 of the molded base 12, so that the base inner side surface forming surface 2142 of the light window forming block 214 and the base outer side surface forming surface 2161 of the dividing blocks 216 are not in friction contact with the inner side surface 124 of the molded base 12 and the outer side surface 125 of the molded base 12 respectively, thereby avoiding deforming and damaging the inner side surface 124 and the outer side surface 125 of the molded base 12 and at the same time facilitating a smooth drafting of the molded base 12.

At the same time, the shape of the base forming guide groove 215 formed by the molding mould 210 is at a suitable gradient without a right-angled corner in such a manner that the liquid form molding material 14 entering in the base forming guide groove 215 has a better liquidity. Furthermore, the first inclination angle α and the second inclination angle γ are acute angles, unlike the right-angle in the conventional art, so that the angle of the top surface 131 of the photosensitive element 13 of the molded circuit board assembly 10 and the inner side surface 124 of the molded base 12 becomes a relatively rounded obtuse angle. The light window forming block 214 and the dividing blocks 216 do not form sharp edges and corners to scratch the inner side surface 124 and the outer side surface 125 of the molded base 12. In addition, the first inclination angle α of the present invention enables the molded base 12 preventing the stray light from affecting the image quality of the camera module 100.

Referring to FIG. 10 to FIG. 21 of the drawings, the molded circuit board assembly 10 of the camera module 100 and the manufacturing process thereof according to a second preferred embodiment of the present invention are illustrated. In this embodiment of the present invention, an integral piece of molded circuit board assembly array 1000 is manufactured by a joint board array operation, and the molded circuit board assembly 10 is obtained by cutting the integral piece of molded circuit board assembly array 1000.

Accordingly, more specifically, the molding chamber 213 is formed when the molding mould 210 is in the closed-mould position, and a plurality of the light window forming blocks 214 and one or more integral base array forming guide grooves 2150 are provided. In other words, a plurality of the base forming guide grooves 215 communicated with each other is provided and these base forming guide grooves 215 form an overall guiding groove.

Before the molding process, an integral piece of circuit board array 1100 is manufactured in advance. The integral piece of circuit board array 1100 comprises a plurality of circuit boards 11 integrally connected with each other.

When the integral piece of circuit board array 1100 is placed in the molding chamber 213 and the molding mould 210 is in the closed-mould position, the solid molding material 14 is heated to melt and is transported to enter the integral base array forming guide groove 2150, thereby the liquid molding material 14 is filled around each of the light window forming blocks 214. Finally, during a solidifying process, the liquid molding material 14 in the integral base array forming guide groove 2150 is solidified and hardened to form the molded base 12 which is integrally molded on each of the circuit boards 11 of the integral piece of circuit board array 1100. These molded bases 12 form an overall integral piece of molded base array 1200.

The molding surface of the first mould 211 contacted with the circuit board 11 is also provided with an elastic film layer 219, so that the molding surface of the first mould 211 is firmly contacted with the circuit board 11 and is more convenient for demoulding.

It is worth mentioning that, when each of the separated molded circuit board assembly 10 manufactured by cutting the integral piece of molded circuit board assembly array 1000 to manufacture the auto-focus cameral module, the molding mould 210 further comprises a plurality of lens actuator pin groove forming blocks 218. Each of the lens actuator pin groove forming blocks 218 is extended in the integral base array forming guide groove 2150, so that in the molding process, the liquid molding material 14 is not filled at the positions corresponding to the lens actuator pin groove forming blocks 218, so that after the solidifying step, a plurality of the light windows 122 and a plurality of the lens actuator pin grooves 127 are formed in the integral piece of molded base array 1200 of the integral piece of molded circuit board assembly array 1000, and the molded base 12 of each of the separated molded circuit board assemblies 10 manufactured through a cutting step is provided with the lens actuator pin grooves 127, so that during the camera module 100 is manufactured, a lens actuator pin 41 of the lens actuator 40 is electrically connected to the circuit board 11 of the molded circuit board assembly 10 by welding or by attaching through a conducting resin.

It is understandable that compared with the manufacturing process of the separated molded circuit board assembly 10 in the above first preferred embodiment of the present invention, in the joint board array operation, two adjacent base forming guide grooves 215 forming two molded bases 12 are jointed together while the plurality of the light window forming blocks 214 are spaced with each other, so that the molding material 14 eventually forms the integral piece of molded base array 1200 with an overall configuration.

In the step of manufacturing the separated molded circuit board assemblies 10, the integral piece of molded circuit board assembly array 1000 is cut into a plurality of molded circuit board assemblies 10 to manufacture the separated cameral module.

Alternatively, two or more molded circuit board assemblies 10 which are combined with each other from the integral piece of molded circuit board assembly array 1000 are separated by cutting so as to manufacture a split type cameral module array. In other words, each of the camera modules of the cameral module array has an individual molded circuit board assembly 10, wherein two or more molded circuit board assemblies 10 are respectively electrically connected to a controlling mainboard of the same electronic device. Thus the cameral module array manufactured by two or more molded circuit board assemblies 10 transmits the images captured by the cameral modules to the controlling mainboard for image information processing.

Figure 22:
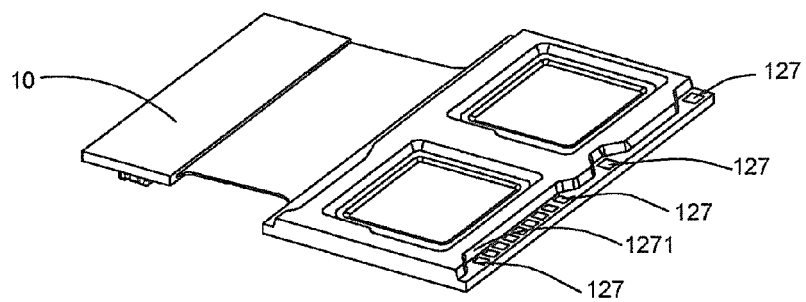
FIG. 22 is a cross-sectional view of a molded circuit board assembly according to an alternative mode of the above second preferred embodiment of the present invention.

As shown in FIG. 22 of the drawings, the molding process of the joint board array operation also can be used to make a molded circuit board assembly 10 with two or more light windows 122, wherein the molded circuit board assembly 10 can be used to make a cameral module array sharing a same base. In other words, take the molded circuit board assembly 10 of an array of double camera modules as an example, for each of the circuit boards 11 of the integral piece of circuit board array 1100 in the molding process, one base board 111 is correspondingly provided with two light window forming blocks 214. The light window forming blocks 214 are spaced with each other and two base forming guide grooves which are communicated with each other are disposed around the light window forming block 214. Therefore, after the molding process, the circuit board 11 together form an integral molded base which shares one base board 111 and have two light windows 122, and that two photosensitive elements 13 and two lenses 30 are then correspondingly mounted. Furthermore, the base board 111 of the circuit board 11 can be connected to a controlling board of an electric board, and thus the camera module array manufactured in this embodiment transmits the images captured by the camera modules to the controlling mainboard for image information processing.

It is worth mentioning that a press-fit distance W is formed on an outer edge of the base board 111 of the circuit board 11 and the outer side surface 125 of the formed molded base 12, so that it is facilitating to demould and to press-fit the base board 111 of the circuit board 11. The press-fit distance W has a range of 0.1~0.6 mm. In a specific example, the press-fit distance W is 0.2 mm.

Figure 23:
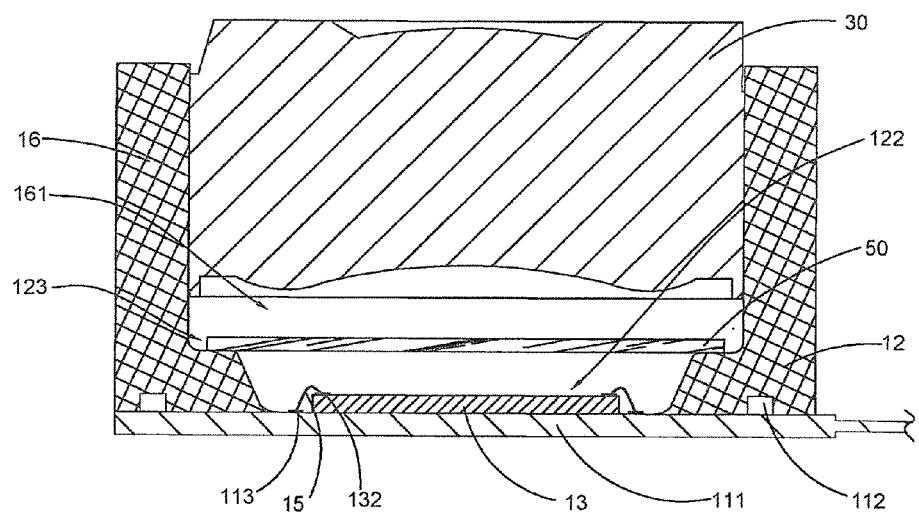
FIG. 23 is a cross-sectional view of a molded circuit board assembly according to an alternative mode of the above second preferred embodiment of the present invention.

As shown in FIG. 23 of the drawings, according to an alternative mode of the above preferred embodiments of the present invention, the molded base 12 is extended integrally and upwardly to form a lens mounting portion 16. The lens mounting portion 16 has a through hole 161 for installing the lens 30. It is worth mentioning that one of the light window forming block 214 and the dividing blocks 216 may have an arc-shaped chamfering transition in the angular position, and it is understandable that in the above-described embodiments, both of the light window forming block 214 and the dividing blocks 216 are configured to have arc-shaped chamfered transitions to prevent damage to the formed molded base 12 during demoulding.

Figure 24:
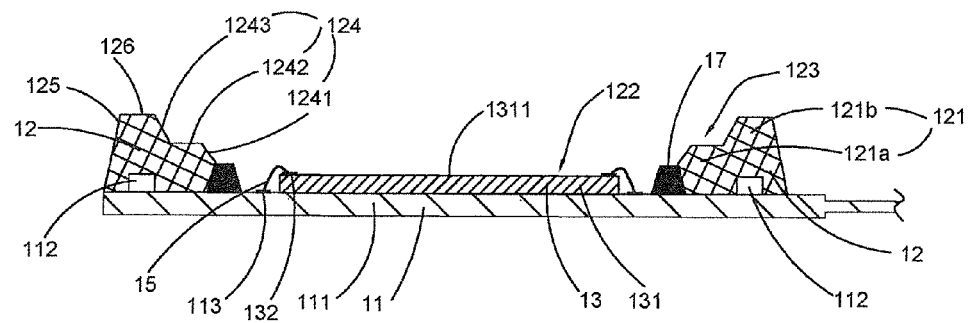
FIG. 24 is a cross-sectional view of a molded circuit board assembly according to an alternative mode of the above second preferred embodiment of the present invention.

As shown in FIG. 24 of the drawings, according to another alternative mode of the above preferred embodiments of the present invention, before the molding process, the photosensitive element 13 connected to the circuit board 11 by the lead wires 15 is provided with an annular blocking element 17. The blocking element 17, which is attached to or coated on the circuit board 11, is made of elastic material and positioned higher than a highest point of each of the lead wires 15, so that during the molding process, the light window forming block 214 is press-fit against the blocking element 17 to prevent the light window forming block 214 from contacting and damaging the circuit board 11, the lead wires 15 and the photosensitive element 13. In some embodiments, the blocking element 17 is square ring-shaped and is implemented as a step adhesive configuration.

Figure 25:
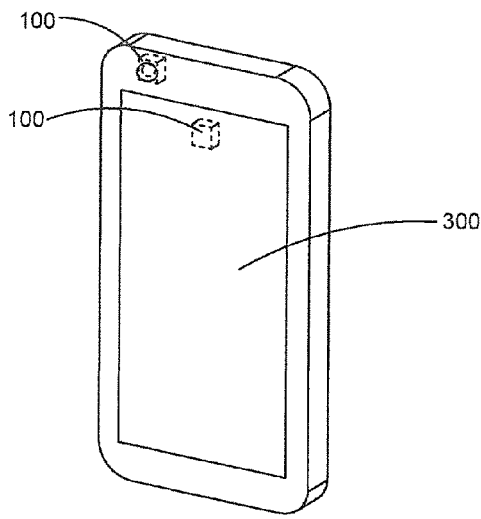
FIG. 25 is a schematic view illustrating the above camera module applied on a mobile phone according to the above embodiment of the present invention.

Referring to FIG. 11 to FIG. 15 of the drawings, the camera module 100 of the second preferred embodiment of the present invention is further illustrated. The camera module 100 comprises a molded circuit board assembly 10. The molded circuit board assembly 10 comprises a circuit board 11 and a molded base 12. The camera module 100 further comprises a lens 30. Wherein the molded base 12 comprises an annular molding body 121 and has a light window 122 in a middle portion thereof to provide a light path for the lens 30 and the photosensitive element 13. The photosensitive element 13 is operatively connected to the circuit board 11. For example, the photosensitive element 13 is connected to the circuit board 11 by leading wires in a COB process, and the photosensitive element 13 is positioned on a top side of the circuit board 11. The photosensitive element 13 and the lens 30 are respectively assembled on two sides of the molded base 12 and are optically aligned in such a manner that the light passing through the lens 30 is able to reach the photosensitive element 13 through the light window 122, so that the camera module 100 is able to provide an optical image through a photoelectric conversion process. As shown in FIG. 25 of the drawings, the camera module 100 applied on an intelligent electronic device 300 is illustrated. For example, the camera module 100 is equipped in a mobile phone and is arranged along a thickness direction of the mobile phone. In addition, one or more camera modules 100 can be assembled at the front and the back of the mobile phone.

Figure 12:
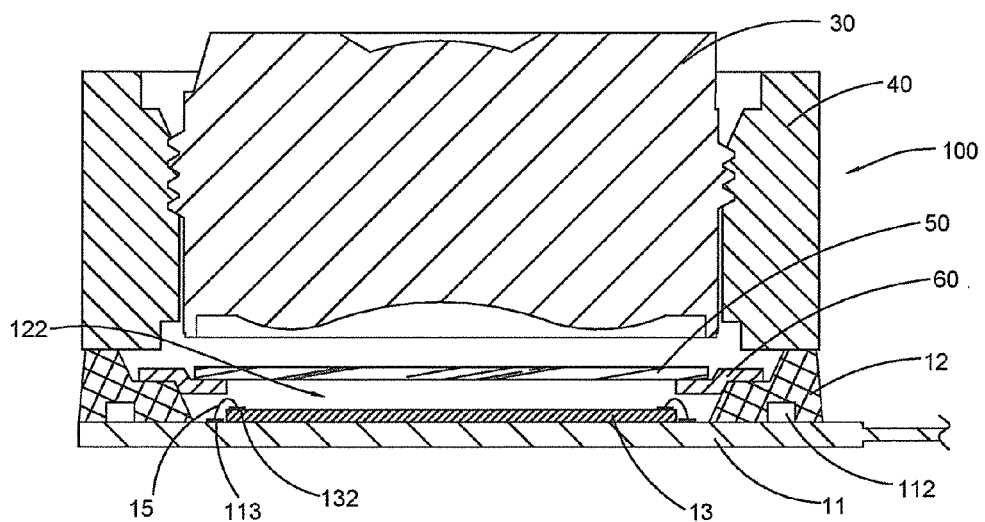
FIG. 12 is a cross-sectional view of the camera module according to an alternative mode of the above second preferred embodiment of the present invention.
Figure 13:
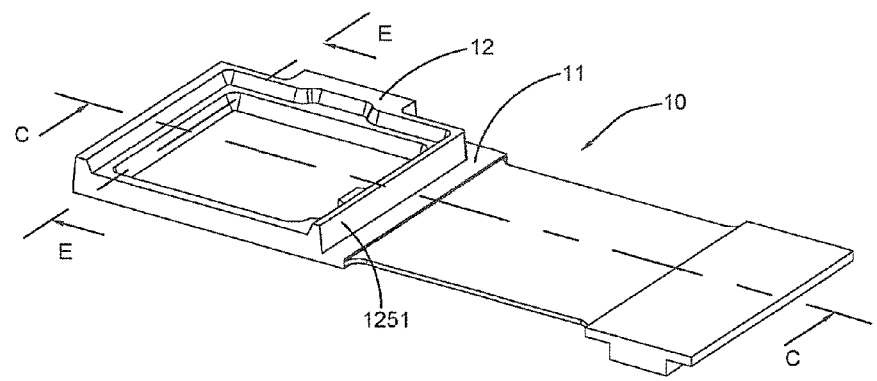
FIG. 13 is a perspective view of molded circuit board assembly of the camera module assembled according to the above second preferred embodiment of the present invention.
Figure 14:
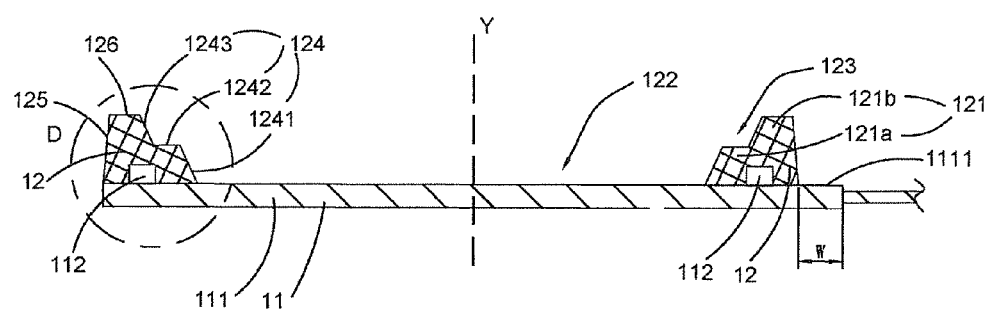
FIG. 14 is a cross-sectional view of the molding mould of the camera module according to the above second preferred embodiment of the present invention along a C-C line of FIG. 13.
Figure 15:
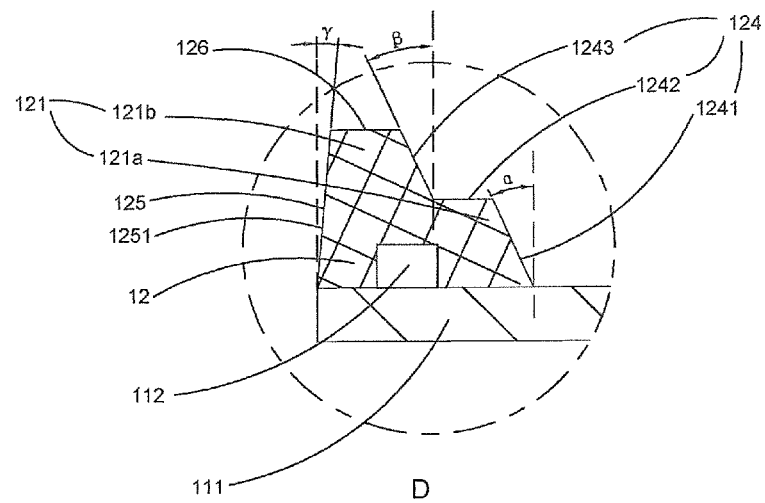
FIG. 15 is a partial enlarged schematic view illustrating an inclination angle for facilitating demoulding of the camera module according to the above second preferred embodiment of the present invention.

The difference between this embodiment and the above first preferred embodiment is that a top groove 123 is formed on a top side of the molded base 12 for mounting the optical filter 50. Alternatively, as shown in FIG. 12 of the drawings, the top groove 123 is used to support an additional optical filter holder 60 for mounting the optical filter 50.

Correspondingly, the circuit board 11 comprises a base board 111 and a plurality of electronic components 112. The plurality of electronic components 112 is formed on the base board 111 using a technology such as the surface mount technology, SMT. The electronic components 112 are enclosed by the molded base 12.

The molded base 12 has an inner side surface 124, an outer side surface 125 and a top side surface 126. In other words, the inner side surface 124 along the inner circumferential direction of the molded base 12, the outer side surface 125 along the outer circumferential direction of the molded base 12 and the annular top side surface 126 define a shape of the annular molding body 121.

In this embodiment, the cross section of the light window 12 is in multi-step-shape such as two steps shaped. The inner side surface 124 of the molded base 12 is not a flatly extended flat inner surface, but a curved extending inner surface. More specifically, the inner side surface 124 is further integrally extended to provide a first portion inner side surface 1241, a second portion inner side surface 1242 and a third portion inner side surface 1243. As shown in the drawings, for example, the camera module 100 being arranged along a vertical direction thereof, the first portion inner side surface 1241 is integrally and inclinedly extended from a top surface 1111 of the base board 111 of the circuit board 11, the second portion inner side surface 1242 is basically extended from the first portion inner side surface 1241 along a horizontal direction, the third portion inner side surface 1243 is integrally and inclinedly extended from the second portion inner side surface 1242. The annular molding body 121 of the molded base 12 is correspondingly formed with a base station portion 121a on a bottom side, and a step portion 121b which is integrally extended from the base station portion 121a. The step portion 121b forms an overall annular step, or the step portion 121b is a multi-section type such as three-section type and one side of the molded base 12 may not have a step protrusion. The step portion 121b has a relative larger diameter than the base station portion 121a. The inner surface of the base station portion 121a is the first portion inner side surface 1241 of the inner side surface 124 of the molded base 12. The inner surface of the step portion 121b is the third portion inner side surface 1243 of the inner side surface 124 of the molded base 12. The top surface of the step portion 121b is the top side surface 126 of the molded base 12.

It is understandable that the first portion inner side surface 1241 and a straight line direction of the optical axis Y of the camera module 100 define a first inclination angle α. In other words, when the camera module 100 is aligned along the vertical direction, the first inclination angle α is defined between the first portion inner side surface 1241 and the vertical line (optical axis Y). The extending direction of the second portion inner side surface 1242 is substantially perpendicular to a straight line direction of the optical axis Y of the camera module 100. A third inclination angle β is defined between the third portion inner side surface 1243 and the straight line direction of the optical axis Y of the camera module 100. That is, when the camera module 100 is aligned in the vertical direction, the third portion inner side surface 1243 and the vertical line have the third inclination angle β therebetween.

Figure 26:
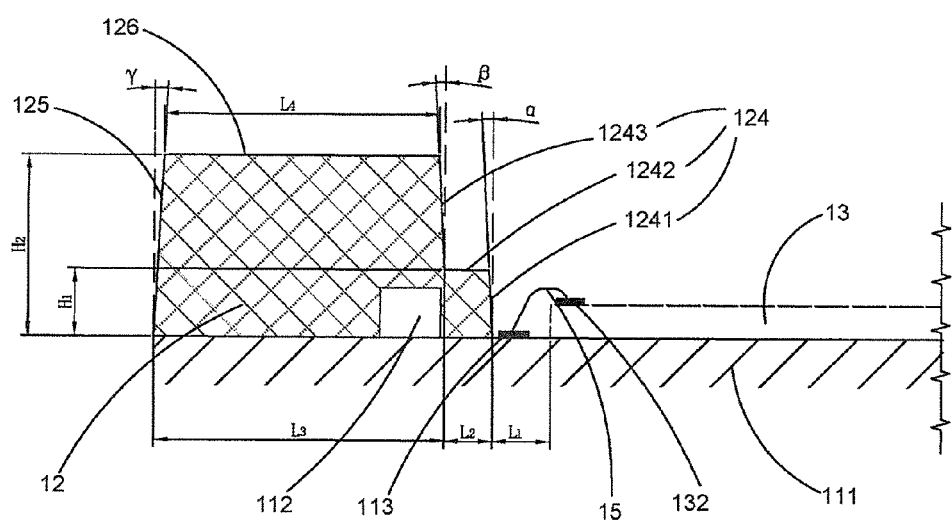
FIG. 26 is a partial enlarged schematic view illustrating an inclination angle for facilitating demoulding of the molded circuit board assembly manufactured by the molding process according to a first example of the above second embodiment of the present invention.

The outer side surface 125 of the molded base 12 which is extended from the 1111 of the base board 111 of the circuit board 11 comprises one or more outer peripheral surfaces 1251. In the second preferred embodiment of the present invention, as the integrally connected integral piece of molded circuit board assembly array 1000 is manufactured and is cut into the separated molded circuit board assemblies 10, some outer peripheral surfaces 1251 of the outer side surface 125 of the molded base 12 of the molded circuit board assembly 10 are formed by cutting, so that the outer peripheral surfaces 1251 can be vertical flat surfaces, while at least one of the outer peripheral surfaces 1251 is defined by the base outer side surface forming surface 2161 of the dividing blocks 216 of the molding mould 210 in the molding process. As shown in FIG. 15 to FIG. 19 of the drawings, the front outer peripheral surfaces 1251 of the molded circuit board assembly 10 obtained by cutting are formed by the base outer side surface forming surface 2161 of the dividing blocks 216 of the molding mould 210. The front outer peripheral surfaces 1251 and the straight line direction of the optical axis Y of the camera module 100 have a second inclination angle γ therebetween. In other words, when the camera module 100 is aligned in the vertical direction, the front outer peripheral surfaces 1251 and the vertical line define the second inclination angle γ. In addition, the molded base 12 is also formed with one or more lens actuator pin grooves 127. Each of the lens actuator pin grooves 127 has a pin groove wall 1271, as shown in FIG. 22. The pin groove wall 1271 and the straight line direction of the optical axis Y of the camera module 100 define a fourth inclination angle δ, as shown in FIG. 26. In other words, when the camera module 100 is aligned in the vertical direction, the pin groove wall 1271 and the vertical line define the fourth inclination angle δ therebetween.

According to this preferred embodiment of the present invention, the angle range of the first inclination angle α is 3°~30°; while in other embodiments, the angle range of the first inclination angle α can be 3° to 15°, or 15°~20°, or 20°~30°. The angle range of the second inclination angle γ is 3°~45°; while in in other embodiments, the angle range of the second inclination angle γ can be 3°~15°, or 15°~30°, or 30°~45°. The angle range of the third inclination angle β is 3°~30°; while in in other embodiments, the angle range of the third inclination angle β can be 3°~15°, or 15°~20°, or 20°~30°. The angle range of the fourth inclination angle δ is 3°~45°; while in in other embodiments, the angle range of the third angle β can be 3°~15°, or 15°~30°, or 30°~45°.

The light window forming block 214 and the dividing blocks 216 are formed in a frustum-conical shape, wherein edges and corners of the light window forming block 214 and the dividing blocks 216 are linearly transitioned or smoothly transitioned in an arc shape. However, the extending angle ranges of the surfaces are substantially within the above-mentioned specific range.

Figure 19:
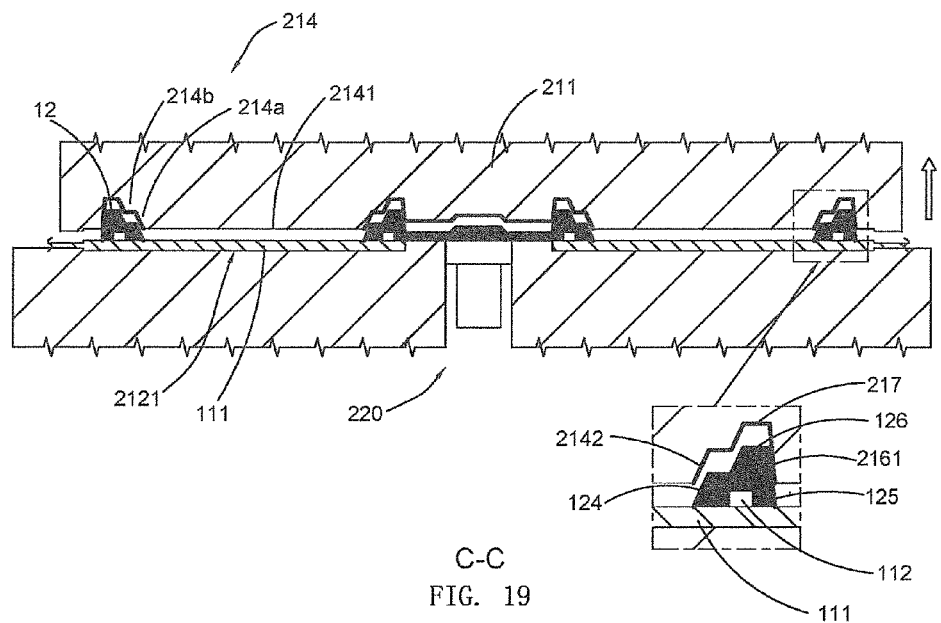
FIG. 19 is a schematic view of a demoulding process of the molded circuit board assembly according to the above second preferred embodiment of the present invention.
Figure 20:
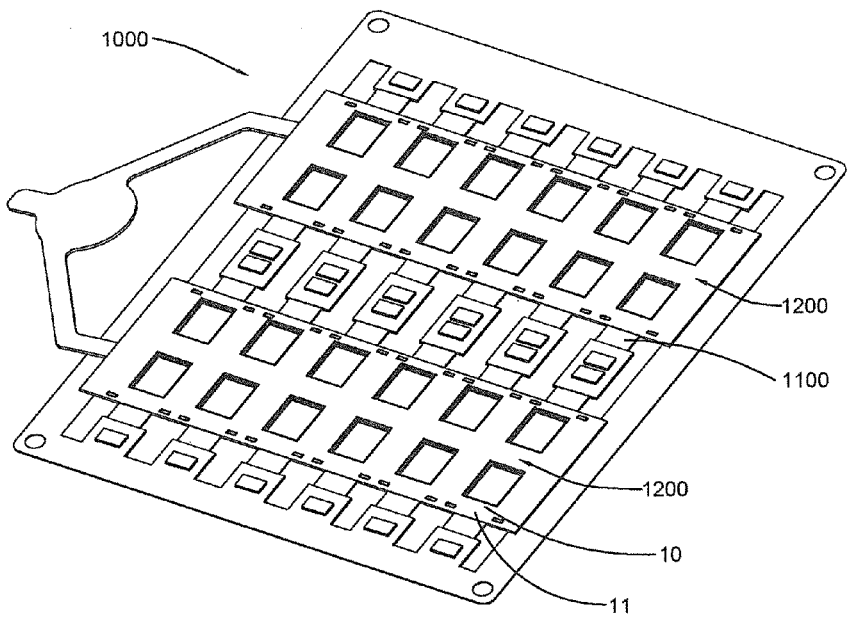
FIG. 20 is a perspective view of an integral piece of molded circuit board assembly array manufactured by the molding process according to the above second preferred embodiment of the present invention.
Figure 21:
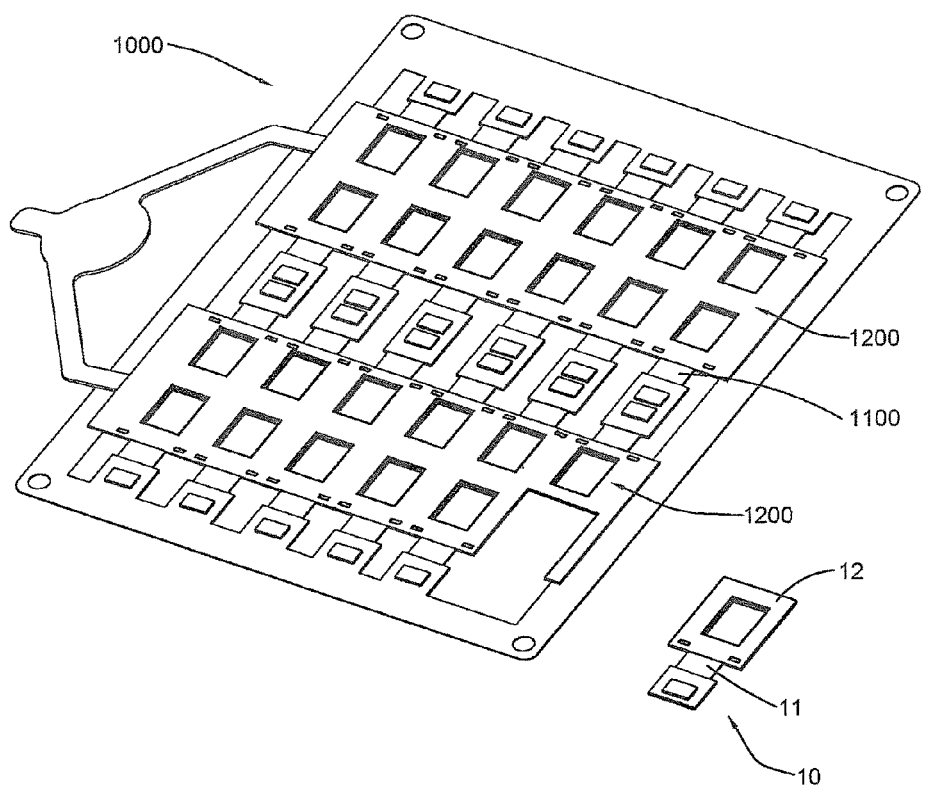
FIG. 21 is a schematic view of a separated molded circuit board assembly cut down from the integral piece of molded circuit board assembly array in the molding process according to the above second preferred embodiment of the present invention.

Correspondingly, the first mould 211 of the molding mould 210 is configured with an overall molding surface to form the molded base 12 with the above structure. More specifically, as shown in the drawings, the light window forming block 214 has a press head portion 214a in a bottom side and a groove forming portion 214b on a top side, as shown in FIG. 19. The press head portion 214a and the groove forming portion 214b together are used to form the light window 122 of the molded base 12. The groove forming portion 214b is used to form the top groove 123 on the top side of the molded base 12.

It is understandable that the light window forming block 214 has a press-fit surface 2141 on a bottom side and a base inner side surface forming surface 2142 along an outer circumferential direction. Furthermore, in this embodiment, the base inner side surface forming surface 2142 of the light window forming block 214 has a first portion forming surface 21421, a second portion forming surface 21422 and a third portion forming surface 21423 which are integrally extended. The first portion forming surface 21421, the second portion forming surface 21422 and the third portion forming surface 21423 are respectively and correspondingly used for forming the first portion inner side surface 1241, the second portion inner side surface 1242 and the third portion inner side surface 1243, which are integrally extended in an inner side of the molded base 12.

According to the embodiment of the present invention, as shown in the drawings, the camera module 100 is vertically aligned, the linear direction of the optical axis Y of the photosensitive element 13 of the camera module 100 is parallel to the vertical line. Correspondingly, the first portion forming surface 21421 and the vertical line define the first inclination angle α, ranging 3°~30°, therebetween. The third portion forming surface 21423 and the vertical line define a third inclination angle β, ranging 3°~30°, therebetween.

Figure 16:
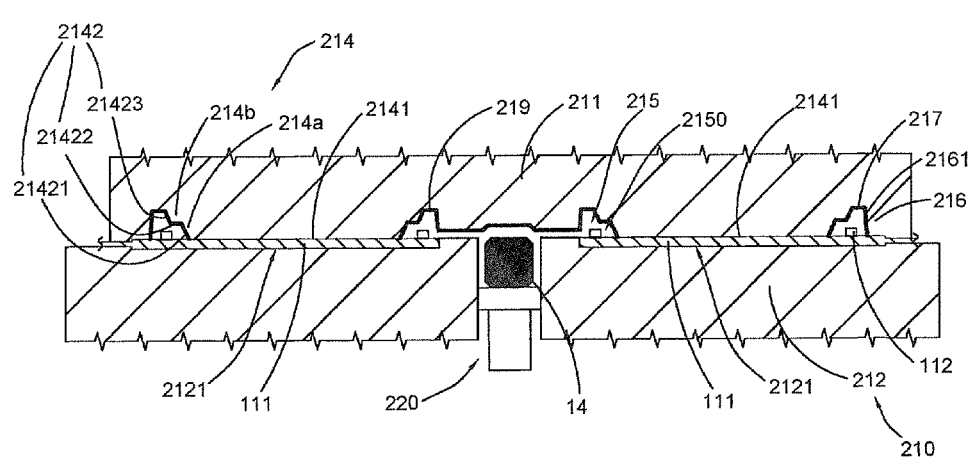
FIG. 16 is a cross-sectional view of the molded circuit board assembly according to the above second preferred embodiment of the present invention, illustrating that a liquid molding material is pushed into a base forming guide groove by a molding mould; the cross-sectional view is along a C-C line of the FIG. 13.
Figure 17:
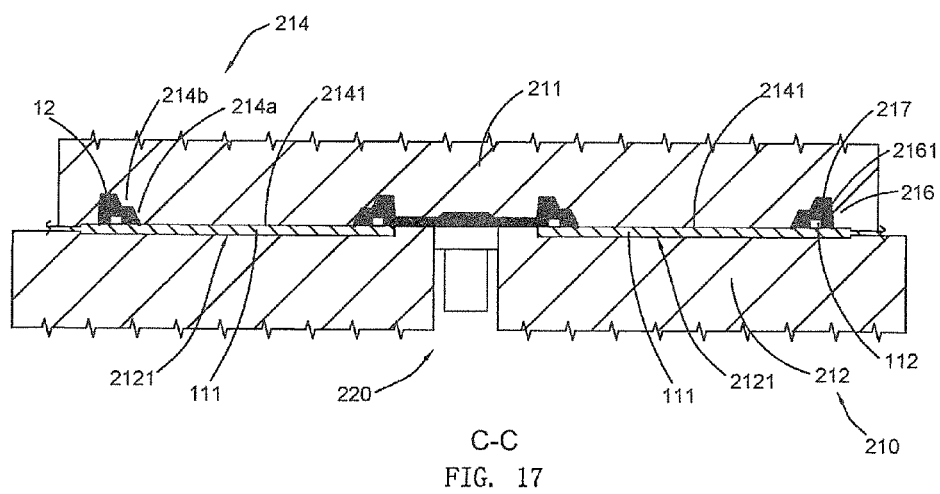
FIG. 17 is a cross-sectional view of the molded circuit board assembly according to the above second preferred embodiment of the present invention, illustrating that a liquid molding material is pushed into the base forming guide groove by the molding mould; the cross-sectional view is along the C-C line of the FIG. 13.
Figure 18:
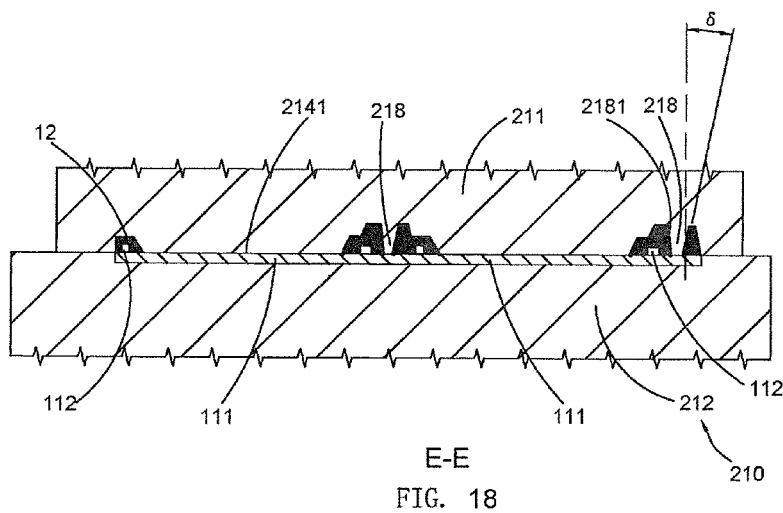
FIG. 18 is a cross-sectional view of the molded circuit board assembly according to the above second preferred embodiment of the present invention, illustrating that the molding mould performs the molding process to form an integral piece of molded bases array, wherein the cross-sectional view is along an E-E line of the FIG. 13.

Correspondingly, the bottom side surface of the press head portion 214a forms the press-fit surface 2141 of the light window forming block 214. The outer side surface of the press head portion 214a forms the first portion forming surface 21421 of the light window forming block 214. The bottom side surface of the groove forming portion 214b forms the second portion forming surface 21422 of the light window forming block 214. The outer side surface of the groove forming portion 214b forms the third portion forming surface 21423 of the base forming guide groove 215. The press head portion 214a and the groove forming portion 214b are configured to be a frustum-conical shape. The press head portion 214a and the groove forming portion 214b have trapezoid cross sections, thereby preventing damages on the elastic film layer 219. More specifically, take the groove forming portion 214b as an example, the molding block in the prior art has sharp edges and corners, and in the demoulding process, the film layer 219 is easy to be pierced on the position where the second portion forming surface 21422 is connected to the third portion forming surface 21423. As shown in FIG. 16, an obtuse angle is defined between the second portion forming surface 21422 on the bottom side of the groove forming portion 214b and the third portion forming surface 21423 on the outer peripheral side of the groove forming portion 214b so as to facilitate the demoulding of the groove forming portion 214b.

Corresponding to that the outer side surface 125 of the molded circuit board assembly 10 has at least one outer peripheral surfaces 1251, each of the dividing blocks 216 has a base outer side surface forming surface 2161. The base outer side surface forming surface 2161 and the vertical line define the second inclination angle γ, having a predetermined range of 3°~45°, therebetween.

The molding mould 210 is further provided with a plurality of the lens actuator pin groove forming blocks 218, each having a pin groove side surface forming surface 2181. The pin groove side surface forming surface 2181 and the vertical line define the fourth inclination angle δ, having a predetermined range of 3°~30°, therebetween.

Correspondingly, the above structure of the first mould 211 of the molding mould 210 and the molded base 12 has the following advantages.

Firstly, it is convenient for demoulding of the dividing blocks 216 and the light window forming block 214 of the first mould 211. In other words, as the first inclination angle α, the second inclination angle γ, the third inclination angle β, and the fourth inclination angle δ, which are acute angles, are provided to facilitate demoulding, the light window forming block 214 and the dividing blocks 216 have reduced frictions with the molded base 12, and that the molded base 12 is easy to be detached to obtain a better molded condition. As shown in FIG. 19 of the drawings, as along as the light window forming block 214 and the dividing blocks 216 are departed from the molded base 12 and have upward and downward relative displacements, there is no frictions between the light window forming block 214 and the dividing blocks 216 with the molded base 12. In other words, the first portion forming surface 21421, the second portion forming surface 21422 and the third portion forming surface 21423 of the light window forming block 214 are respectively separated with the first portion inner side surface 1241, the second portion inner side surface 1242 and the third portion inner side surface 1243 of the molded base 12, and that the base outer side surface forming surface 2161 of the dividing blocks 216 and the outer side surface 125 of the molded base 12 are separated, so that the light window forming block 214 and the dividing blocks 216 are capable of being easily detached from the molded base 12, thereby reducing the adverse influence to the molded condition of the molded base 12.

Secondly, the shape of the integral base array forming guide groove 2150 formed by the molding mould 210 has no right-angled corner and has a suitable gradient such that the liquid state molding material 14 has a better liquidity filling the base forming guide groove 215. In other words, as the molding material 14 is generally in a liquid state during the molding process and is needed to flow into the molding chamber 213, the size of flowing area influences the filling effect of the molding material 14. The structure of the integral base array forming guide groove 2150 in the embodiment of the present invention increases the flowing rate of the molding material 14, so that the molded base 12 is molded in a shorter time and is benefit for the molding of the molded base 12.

Thirdly, the first inclination angle α, the second inclination angle γ, the third inclination angle β, and the fourth inclination angle δ are acute angles, unlike the right angle in the prior art, so that the light window forming block 214 and the dividing blocks 216 will not have sharp edges and corners that would scratch and damage the inner side surface 124 and the outer side surface 125 of the molded base 12.

Fourthly, as the first inclination angle α, the second inclination angle γ, the third inclination angle β, and the fourth inclination angle δ are acute angles, the inner side surface 124 of the molded base 12, at least one portion of the outer side surface 125 and the pin groove wall 1271 are in inclined shape, so that the size of the molded base 12 is relatively smaller and the overall amount of the molding material 14 needed to be filled is decreased too.

Fifthly, the acute angle range of the first inclination angle α and the third inclination angle β are capable of avoiding the stray light to adversely affect the imaging quality of the camera module 100. More specifically, it reduces the possibility of stray light reaching the photosensitive element photosensitive element 13. That is, when the incident stray light in the camera module 100 is reflected by the curved extending inner side surface 124 of the molded base 12, the inclined first portion inner side surface 1241, the inclined third portion inner side surface 1243 and the second portion inner side surface 1242 which is extended along the horizontal direction reflect the incident stray light away from the photosensitive element 13, so that the stray light will not reach the photosensitive element 13 to adversely affect the image quality of the camera module 100.

In addition, the ranges of the first inclination angle α, the second inclination angle γ and the third inclination angle β enable the molded base 12 having a better supporting ability. For example, the top side surface 126 would have enough size to facilitate the installation of the lens 30 or the lens actuator 40. It also ensures the second portion inner side surface 1242 having a sufficient size to facilitate the installation of the optical filter 50 or the optical filter holder 60. In other words, the first inclination angle α, the second inclination angle γ and the third inclination angle β cannot be too large to avoid the length of the top side surface 126 being too small so as to provide a secure and stable installation site and position for the lens 30 or the lens actuator 40.

Referring to FIG. 26 to FIG. 29 of the drawings, four examples of the range of the first inclination angle α, the second inclination angle γ and the third inclination angle β according to the second embodiment of the present invention are illustrated respectively. According to these four examples, the first inclination angle α is defined between the first portion inner side surface 1241 of the molded base 12 and the vertical line, the second inclination angle γ is defined between at least one outer peripheral surfaces 1251 of the outer side surface 125 along the outer peripheral direction of the molded base 12 and the vertical line, and the third inclination angle β is defined between the third portion inner side surface 1243 of the inner side surface 124 of the molded base 12 and the vertical line. A distance L1 is formed between the edge of photosensitive element 13 and a connecting position of the first portion inner side surface 1241 of the molded base 12 and the circuit board 11. A distance L2 is formed between a connecting position of the first portion inner side surface 1241 and the circuit board and a connecting position of the second portion inner side surface 1242 and the third portion inner side surface 1243. A distance L3 is formed between a connecting position of the second portion inner side surface 1242 and the third portion inner side surface 1243 and a connecting position of the outer side surface 125 of the molded base 12 and the circuit board 11. L4 denotes a length of the top side surface 126 of the molded base 12. The distance from the second portion inner side surface 1242 to the top surface of the base board 111 of the circuit board 11 is H1. The distance from the top side surface 126 of the molded base 12 to the top surface of the base board 111 of the circuit board 11 is H2.

In addition, the second inclination angle γ and the third inclination angle β should not be too large so as to ensure that the second portion inner side surface 1242 and the top side surface 126 have enough sizes to facilitate demoulding and avoid stray lights. In other words, the angle ranges of the second inclination angle γ and the third inclination angle β have restrictive relations with respect to the above parameters L1, L2, L3, L4, H1 and H2.

As shown in FIG. 26 of the drawings, α is 3°, β is 3° and γ is 3°, wherein the L1 numerical value is 0.25 mm, the L2 numerical value is 0.21 mm, the L3 numerical value is 1.25 mm, the L4 numerical value is 1.18 mm, the H1 numerical value is 0.29 mm, and the H2 numerical value is 0.78 mm, so that each of the first inclination angle α, the second inclination angle γ and the third inclination angle β has an appropriate minimum value accordingly.

Figure 27:
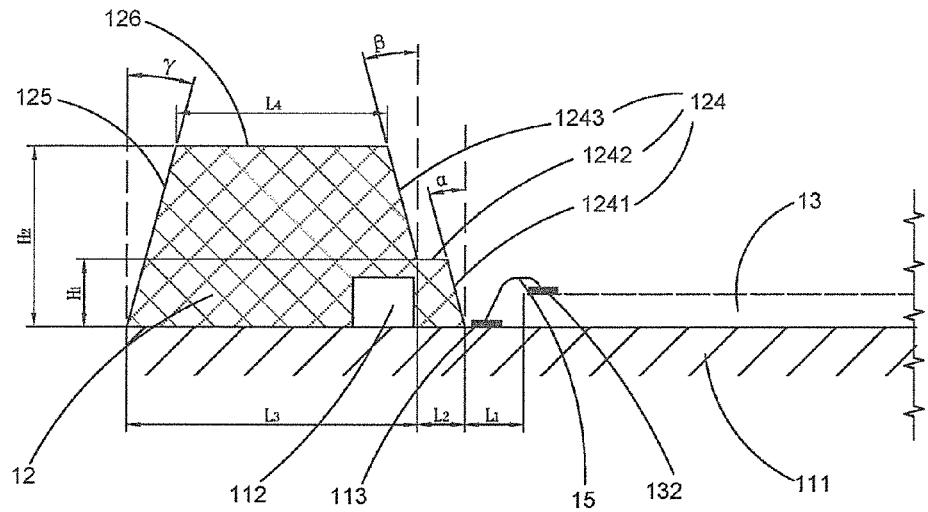
FIG. 27 is a partial enlarged schematic view illustrating an inclination angle for facilitating demoulding of the molded circuit board assembly manufactured by the molding process according to a second example of the above second embodiment of the present invention.

As shown in FIG. 27 of the drawings, α is 15°, β is 15° and γ is 15°, wherein the L1 numerical value is 0.25 mm, the L2 numerical value is 0.21 mm, the L3 numerical value is 1.25 mm, the L4 numerical value is 0.91 mm, the H1 numerical value is 0.29 mm, and the H2 numerical value is 0.78 mm.

Figure 28:
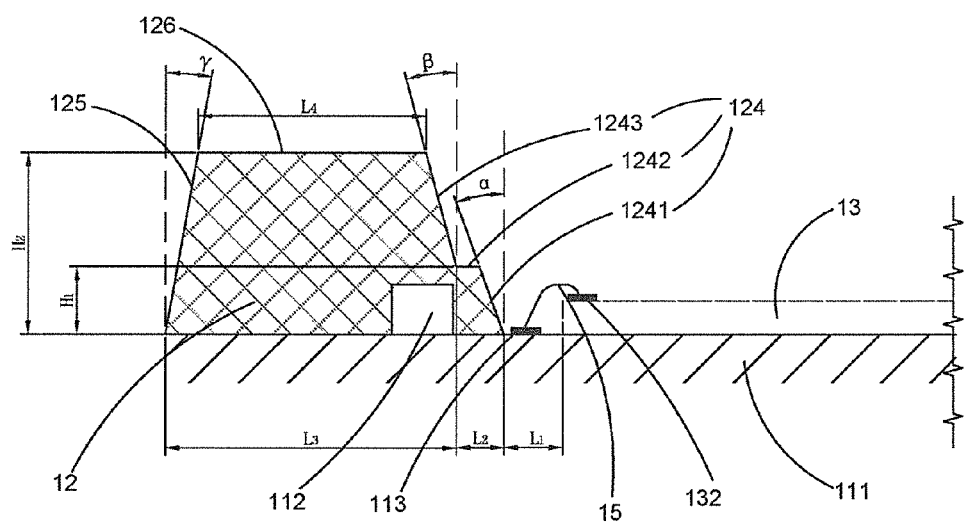
FIG. 28 is a partial enlarged schematic view illustrating an inclination angle for facilitating demoulding of the molded circuit board assembly manufactured by the molding process according to a third example of the above second embodiment of the present invention.

As shown in FIG. 28 of the drawings, α is 20°, β is 15° and γ is 10°, wherein the L1 numerical value is 0.25 mm, the L2 numerical value is 0.21 mm, the L3 numerical value is 1.25 mm, the L4 numerical value is 0.98 mm, the H1 numerical value is 0.29 mm, and the H2 numerical value is 0.78 mm.

Figure 29:
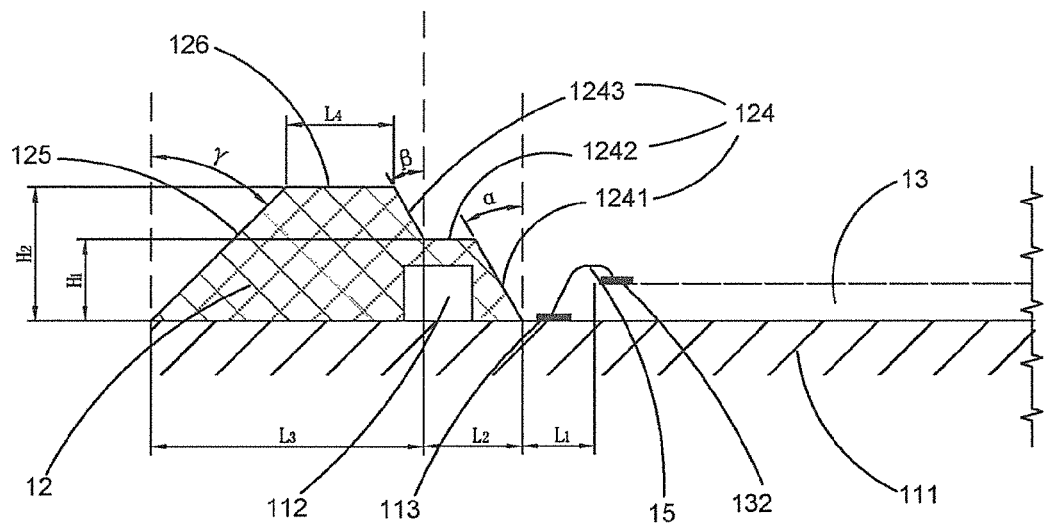
FIG. 29 is a partial enlarged schematic view illustrating an inclination angle for facilitating demoulding of the molded circuit board assembly manufactured by the molding process according to a fourth example of the above second embodiment of the present invention.

As shown in FIG. 29 of the drawings, α is 30°, β is 30° and γ is 45°, wherein the L1 numerical value is 0.28 mm, the L2 numerical value is 0.38 mm, the L3 numerical value is 1.05 mm, the L4 numerical value is 0.41 mm, the H1 numerical value is 0.32 mm, and the H2 numerical value is 0.52 mm, so that each of the first inclination angle α, the second inclination angle γ and the third inclination angle β has an appropriate maximum value correspondingly.

It is understandable that the numerical values of above parameters L1, L2, L3, L4, H1, and H2 are exemplary only and not intended to be limiting the scope of the present invention. In the practical applications, the numerical values thereof may change with the specification requirements of the camera module 100 and the molded circuit board assembly 10.

According to this embodiment of the present invention, it is illustrated from the above-exemplified data that an appropriate range of the first inclination angle α is 3° to 30°, an appropriate range of the second inclination angle γ is 3° to 45°, and an appropriate range of the third inclination angle β is 3° to 30°.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
   at least one lens,
   at least one photosensitive element having a photosensitive area portion and a non-photosensitive area portion surrounding said photosensitive area portion, and
   at least one molded circuit board assembly, comprising;
   at least one circuit board comprising one or more electronic components thereon, wherein said photosensitive element is positioned on said circuit board and electrically connected with said circuit board through one or more connecting elements;
   at least one molded base comprising an annular molding body being molded to integrally form with said circuit board through a molding process and having at least one light window formed therein to provide a light path for said photosensitive element and said lens installed on said molded base, wherein said molding body of said molded base has an annular inner side surface which is integrally extended from said circuit board to define said light window positioned between said lens and said photosensitive element such that a light passing through said lens is able to reach the photosensitive element via said light window, wherein at least one portion of said inner side surface is inclinedly extended upwardly and outwardly from said circuit board, wherein said inner side surface of said molding body of said molded base and an optical axis line direction of said camera module define an inclination angle α having an angle range of 3° to 30° for facilitating demoulding in said molding process and avoiding stray light, wherein said molding body of said molded base has an annular outer side surface inclinedly extended upwardly and inwardly from said circuit board, wherein said outer side surface of said molding body of said molded base and said optical axis line direction of said camera module define an inclination angle γ having an angle range of 3° to 45° for facilitating demoulding in said molding process, wherein said molding body of said molded base is integrally molded to embed and enclose said electronic components therein so as to prevent said electronic components being exposed to outside and being contaminated and polluted while a thickness of said molded base is reduced by eliminating the need of providing any additional lens holder to be adhered to said circuit board and the receiving space of such lens holder for said electronic components;
   at least an optical filter holder, having a ring shape, supported on top of said molding body of said molded base; and
   at least one optical filter mounted on said optical filter holder and positioned above said light window and at least said photosensitive area portion of said photosensitive element to filter said light passing through said lens before reaching said photosensitive element via said light window.

2. The camera module, as recited in claim 1, wherein a top surface of said molding body of said molded base is a flat surface parallel to said photosensitive area portion of said photosensitive element and said lens and said optical filter are mounted on top of said molding body of said molded base of said molded circuit board assembly.

3. The camera module, as recited in claim 1, wherein said molded base has a top end and a top groove formed in said top end of said molded base, wherein said inner side surface of said molded base has a first portion inner side surface, a second portion inner side surface and a third portion inner side surface which are successively and integrally extended upwardly and outwardly, wherein said first portion inner side surface is integrally and inclinedly extended from said circuit board, said second portion inner side surface is a horizontal surface extended outwardly between said first and third inner side surfaces, and said third portion inner side surface is integrally and inclinedly extended upwardly and outwardly from said second portion inner side surface, wherein said second portion inner side surface and said third portion inner side surface define said top groove, wherein said optical filter holder is mounted in said top groove so that a thickness of said molded circuit board assembly is further reduced while said optical filter holder is mounted in said top groove and said optical filter is mounted on said optical filter holder without protruding from said molding body of said molded base.

4. The camera module, as recited in claim 3, wherein said first portion inner side surface of said molded base and an optical axis line direction of said camera module define said inclination angle α having said angle range of 3° to 30° for facilitating said demoulding process, wherein said third portion inner side surface of said molded base and said optical axis line direction of said camera module define an inclination angle β having an angle range of 3° to 30°.

5. The camera module, as recited in claim 1, wherein said circuit board comprises a base board, wherein at an outer side of at least one outer peripheral surface of said outer side surface of said molding body of said molded base, said base board of said circuit board has a press-fit distance W, wherein a numerical value range of said press-fit distance W is 0.1 to 0.6 mm.

6. The camera module, as recited in claim 4, wherein said circuit board comprises a base board, wherein at an outer side of at least one outer peripheral surface of said outer side surface of said molding body of said molded base, said base board of said circuit board has a press-fit distance W, wherein a numerical value range of said press-fit distance W is 0.1 to 0.6 mm.

7. The camera module, as recited in claim 1, wherein a material surface reflectivity of said molded base is less than 5% in a wavelength range of 435 nm to 660 nm.

8. The camera module, as recited in claim 4, wherein a material surface reflectivity of said molded base is less than 5% in a wavelength range of 435 nm to 660 nm.

9. The camera module, as recited in claim 1, wherein said molded base further comprises an annular blocking element which is provided on said circuit board and positioned between said circuit board and said molding body.

10. The camera module, as recited in claim 4, wherein said molded base further comprises an annular blocking element which is provided on said circuit board and positioned between said circuit board and said molding body.

11. The camera module, as recited in claim 4, wherein said inclination angle α is 3°, said inclination angle γ is 3° and said inclination angle β is 3°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 1.18 mm, wherein a distance H1 from said second portion inner side surface to a top surface of said circuit board is 0.29 mm, wherein a distance from said top side surface of said molding body of said molded base to said top surface of said circuit board is 0.78 mm.

12. The camera module, as recited in claim 4, wherein said inclination angle α is 15°, said inclination angle γ is 15° and said inclination angle β is 15°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 0.91 mm, wherein a distance H1 from said second portion inner side surface to a top surface of said circuit board is 0.29 mm, wherein a distance from said top side surface of said molding body of said molded base to said top surface of said circuit board is 0.78 mm.

13. The camera module, as recited in claim 4, wherein said inclination angle α is 20°, said inclination angle γ is 15° and said inclination angle β is 10°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 0.98 mm, wherein a distance H1 from said second portion inner side surface to a top surface of said circuit board is 0.29 mm, wherein a distance from said top side surface of said molding body of said molded base to said top surface of said circuit board is 0.78 mm.

14. The camera module, as recited in claim 4, wherein said inclination angle α is 30°, said inclination angle γ is 30° and said inclination angle β is 45°, wherein a distance L1 between an edge of said photosensitive element and a connecting position of said first portion inner side surface of said molding body of said molded base is 0.28 mm, wherein a distance L2 between a connecting position of said first portion inner side surface and said circuit board and a connecting position of said second portion inner side surface and said third portion inner side surface is 0.38 mm, wherein a distance L3 between a connecting position of said second portion inner side surface and said third portion inner side surface and a connecting position of said outer side surface of said molding body of said molded base and said circuit board is 1.05 mm, wherein a length L4 of a top side surface of said molding body of said molded base is 0.41 mm, wherein a distance H1 from said second portion inner side surface to a top surface of said circuit board is 0.32 mm, wherein a distance from said top side surface of said molding body of said molded base to said top surface of said circuit board is 0.52 mm.

15. The camera module, as recited in claim 4, wherein said molded base provides one or more lens actuator pin grooves, each having at least a pin groove wall, wherein said pin groove wall and a vertical line direction of an optical axis of said camera module define an inclination angle δ having an angle range of 3° to 45°.

16. A camera module, comprising:
   at least one lens,
   at least one photosensitive element having a photosensitive area portion and a non-photosensitive area portion surrounding said photosensitive area portion, and
   at least one molded circuit board assembly, comprising;
   at least one circuit board comprising one or more electronic components thereon, wherein said photosensitive element is positioned on said circuit board and electrically connected with said circuit board through one or more connecting elements;
   at least one molded base comprising an annular molding body being molded to integrally form with said circuit board through a molding process and having at least one light window formed therein to provide a light path for said photosensitive element and said lens installed on said molded base, wherein said molding body of said molded base has an annular inner side surface which is integrally extended from said circuit board to define said light window positioned between said lens and said photosensitive element such that a light passing through said lens is able to reach the photosensitive element via said light window, wherein at least one portion of said inner side surface is inclinedly extended upwardly and outwardly from said circuit board, wherein said inner side surface of said molding body of said molded base and an optical axis line direction of said camera module define an inclination angle α for facilitating demoulding in said molding process and avoiding stray light, wherein said molding body of said molded base has an annular outer side surface inclinedly extended upwardly and inwardly from said circuit board, wherein said outer side surface of said molding body of said molded base and said optical axis line direction of said camera module define an inclination angle γ for facilitating demoulding in said molding process, wherein said angle range of said inclination angle α is selected from the range group consisting of 3° to 15°, 15° to 20° and 20° to 30°, wherein said angle range of said inclination angle γ is selected from the range group consisting of 3° to 15°, 15° to 30° and 30° to 45°, wherein said molding body of said molded base is integrally molded to embed and enclose said electronic components therein so as to prevent said electronic components being exposed to outside and being contaminated and polluted while a thickness of said molded base is reduced by eliminating the need of providing any additional lens holder to be adhered to said circuit board and the receiving space of such lens holder for said electronic components;
   at least an optical filter holder, having a ring shape, supported on top of said molding body of said molded base; and
   at least one optical filter mounted on said optical filter holder and positioned above said light window and at least said photosensitive area portion of said photosensitive element to filter said light passing through said lens before reaching said photosensitive element via said light window.

17. The camera module, as recited in claim 16, wherein said circuit board comprises a base board, wherein at an outer side of at least one outer peripheral surface of said outer side surface of said molding body of said molded base, said base board of said circuit board has a press-fit distance W, wherein a numerical value range of said press-fit distance W is 0.1 to 0.6 mm.

18. The camera module, as recited in claim 16, wherein a material surface reflectivity of said molded base is less than 5% in a wavelength range of 435-660 nm.

19. The camera module, as recited in claim 17, wherein a material surface reflectivity of said molded base is less than 5% in a wavelength range of 435 to 660 nm.

20. The camera module, as recited in claim 16, wherein said molded base further comprises an annular blocking element which is provided on said circuit board and positioned between said circuit board and said molding body.

21. A camera module, comprising:
   at least one lens,
   at least one photosensitive element having a photosensitive area portion and a non-photosensitive area portion surrounding said photosensitive area portion, and
   at least one molded circuit board assembly, comprising;
   at least one circuit board comprising one or more electronic components thereon, wherein said photosensitive element is positioned on said circuit board and electrically connected with said circuit board through one or more connecting elements;
   at least one molded base comprising an annular molding body being molded to integrally form with said circuit board through a molding process and having at least one light window formed therein to provide a light path for said photosensitive element and said lens installed on said molded base, wherein said molding body of said molded base has an annular inner side surface which is integrally extended from said circuit board to define said light window positioned between said lens and said photosensitive element such that a light passing through said lens is able to reach the photosensitive element via said light window, wherein at least one portion of said inner side surface is inclinedly extended upwardly and outwardly from said circuit board, wherein said inner side surface of said molding body of said molded base and an optical axis line direction of said camera module define an inclination angle α for facilitating demoulding in said molding process and avoiding stray light, wherein said molding body of said molded base has an annular outer side surface inclinedly extended upwardly and inwardly from said circuit board, wherein said molding body of said molded base is integrally molded to embed and enclose said electronic components therein so as to prevent said electronic components being exposed to outside and being contaminated and polluted while a thickness of said molded base is reduced by eliminating the need of providing any additional lens holder to be adhered to said circuit board and the receiving space of such lens holder for said electronic components, wherein said molded base has a top end and a top groove formed in said top end of said molded base, wherein said inner side surface of said molded base has a first portion inner side surface, a second portion inner side surface and a third portion inner side surface which are successively and integrally extended upwardly and outwardly, wherein said first portion inner side surface is integrally and inclinedly extended from said circuit board, said second portion inner side surface is a horizontal surface extended outwardly between said first and third inner side surfaces, and said third portion inner side surface is integrally and inclinedly extended upwardly and outwardly from said second portion inner side surface, wherein said second portion inner side surface and said third portion inner side surface define said top groove, wherein said outer side surface of said molding body of said molded base and said optical axis line direction of said camera module define an inclination angle γ for facilitating demoulding in said molding process, wherein said first portion inner side surface of said molded base and an optical axis line direction of said camera module define said inclination angle α having said angle range of 3° to 30° for facilitating said demoulding process, wherein said third portion inner side surface of said molded base and said optical axis line direction of said camera module define an inclination angle β, wherein said angle range of said inclination angle α is selected from the range group consisting of 3° to 15°, 15° to 20° and 20° to 30°, wherein said angle range of said inclination angle γ is selected from the range group consisting of 3° to 15°, 15° to 30° and 30° to 45°, wherein said angle range of said inclination angle β is selected from the range group consisting of 3° to 15°, 15° to 20° and 20° to 30°;

at least an optical filter holder, having a ring shape, supported on top of said molding body of said molded base, wherein said optical filter holder is mounted in said top groove so that a thickness of said molded circuit board assembly is further reduced while said optical filter holder is mounted in said top groove and said optical filter is mounted on said optical filter holder without protruding from said molding body of said molded base; and at least one optical filter mounted on said optical filter holder and positioned above said light window and at least said photosensitive area portion of said photosensitive element to filter said light passing through said lens before reaching said photosensitive element via said light window.

22. The camera module, as recited in claim 21, wherein said circuit board comprises a base board, wherein at an outer side of at least one outer peripheral surface of said outer side surface of said molding body of said molded base, said base board of said circuit board has a press-fit distance W, wherein a numerical value range of said press-fit distance W is 0.1 to 0.6 mm.

23. The camera module, as recited in claim 21, wherein a material surface reflectivity of said molded base is less than 5% in a wavelength range of 435 nm to 660 nm.

24. The camera module, as recited in claim 22, wherein a material surface reflectivity of said molded base is less than 5% in a wavelength range of 435 nm to 660 nm.

25. The camera module, as recited in claim 21, wherein said molded base further comprises an annular blocking element which is provided on said circuit board and positioned between said circuit board and said molding body.

26. The camera module, as recited in claim 23, wherein said molded base further comprises an annular blocking element which is provided on said circuit board and positioned between said circuit board and said molding body.

27. The camera module, as recited in claim 22, wherein said inclination angle α is 3°, said inclination angle γ is 3° and said inclination angle β is 3°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 1.18 mm, wherein a distance H1 from said second portion inner side surface to a top surface of said circuit board is 0.29 mm, wherein a distance from said top side surface of said molding body of said molded base to said top surface of said circuit board is 0.78 mm.

28. The camera module, as recited in claim 22, wherein said inclination angle α is 15°, said inclination angle γ is 15° and said inclination angle β is 15°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 0.91 mm, wherein a distance 141 from said second portion inner side surface to a top surface of said circuit board is 0.29 mm, wherein a distance from said top side surface of said molding body of said molded base to said top surface of said circuit board is 0.78 mm.

29. The camera module, as recited in claim 22, wherein said inclination angle α is 20°, said inclination angle γ is 15° and said inclination angle β is 10°, wherein a distance L1 between an edge of said photosensitive element and a connecting position of said first portion inner side surface of said molding body of said molded base is 0.25 mm, wherein a distance L2 between a connecting position of said first portion inner side surface and said circuit board and a connecting position of said second portion inner side surface and said third portion inner side surface is 0.21 mm, wherein a distance L3 between a connecting position of said second portion inner side surface and said third portion inner side surface and a connecting position of said outer side surface of said molding body of said molded base and said circuit board is 1.25 mm, wherein a length L4 of a top side surface of said molding body of said molded base is 0.98 mm, wherein a distance H1 from said second portion inner side surface to a top surface of said circuit board is 0.29 mm, wherein a distance from said top side surface of said molding body of said molded base to said top surface of said circuit board is 0.78 mm.

30. The camera module, as recited in claim 22, wherein said inclination angle α is 30°, said inclination angle γ is 30° and said inclination angle β is 45°, wherein a distance L1 between an edge of said photosensitive element and a connecting position of said first portion inner side surface of said molding body of said molded base is 0.28 mm, wherein a distance L2 between a connecting position of said first portion inner side surface and said circuit board and a connecting position of said second portion inner side surface and said third portion inner side surface is 0.38 mm, wherein a distance L3 between a connecting position of said second portion inner side surface and said third portion inner side surface and a connecting position of said outer side surface of said molding body of said molded base and said circuit board is 1.05 mm, wherein a length L4 of a top side surface of said molding body of said molded base is 0.41 mm, wherein a distance H1 from said second portion inner side surface to a top surface of said circuit board is 0.32 mm, wherein a distance from said top side surface of said molding body of said molded base to said top surface of said circuit board is 0.52 mm.

* * * * *